(12) United States Patent
Kawasaki

(10) Patent No.: US 8,352,069 B2
(45) Date of Patent: Jan. 8, 2013

(54) SUBSTRATE PROCESSING APPARATUS AND DISPLAY METHOD FOR SUBSTRATE PROCESSING APPARATUS

(75) Inventor: Junichi Kawasaki, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 449 days.

(21) Appl. No.: 12/632,295

(22) Filed: Dec. 7, 2009

(65) Prior Publication Data
US 2010/0152887 A1 Jun. 17, 2010

(30) Foreign Application Priority Data

Dec. 10, 2008 (JP) .................................. 2008-313853
Nov. 13, 2009 (JP) .................................. 2009-260498

(51) Int. Cl.
*G06F 7/00* (2006.01)
*G01R 31/26* (2006.01)

(52) U.S. Cl. ........................... 700/228; 700/229; 428/14

(58) Field of Classification Search ...................... None
See application file for complete search history.

(56) References Cited

U.S. PATENT DOCUMENTS

2009/0114150 A1* 5/2009 Yoneda et al. ................ 118/696
2010/0055808 A1* 3/2010 Ozaki et al. ..................... 438/14

FOREIGN PATENT DOCUMENTS

| JP | 5-260167 | 10/1993 |
| JP | 2002-110496 | 4/2002 |
| JP | 2003-031512 | 1/2003 |
| JP | 2005-260108 | 9/2005 |
| JP | 2006-308349 | 11/2006 |

* cited by examiner

*Primary Examiner* — Gene Crawford
*Assistant Examiner* — Yolanda Jones
(74) *Attorney, Agent, or Firm* — Brundidge & Stanger, P.C.

(57) ABSTRACT

During a carrying operation, the position, transportation origin, and transportation destination of a carrier or a boat can be easily checked. A carrying system is configured to carry a substrate, a manipulation unit is configured to display an operation state of the carrying system on a manipulation screen, and a control unit is configured to control an operation of the carrying system. The manipulation unit displays a carrying system icon indicating the carrying system which is a carrying target object and a carrying-out icon at predetermined positions of the manipulation screen corresponding to a transportation origin of the carrying system, and a carrying-in icon at a predetermined position of the manipulation screen corresponding to the transportation destination of the carrying system.

20 Claims, 13 Drawing Sheets

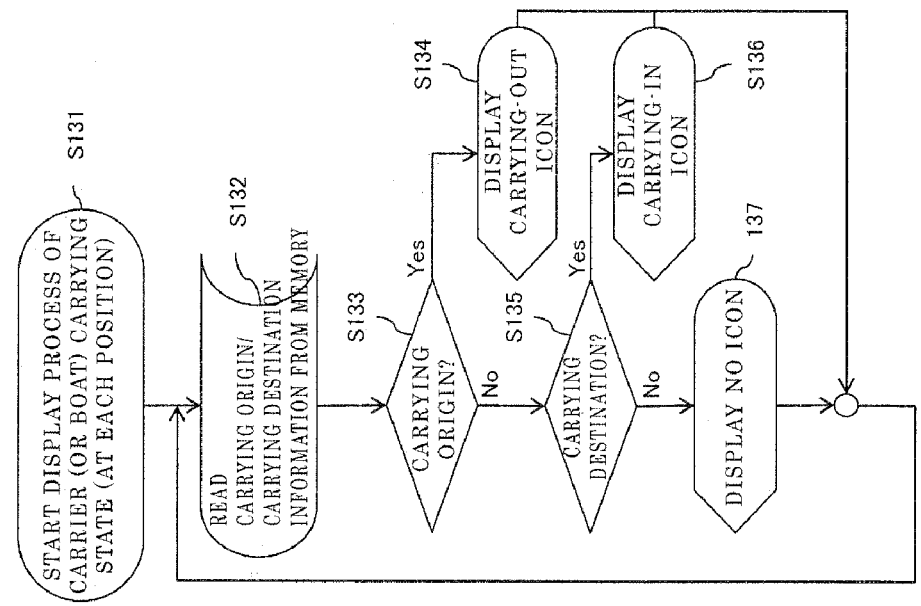
Fig. 6D
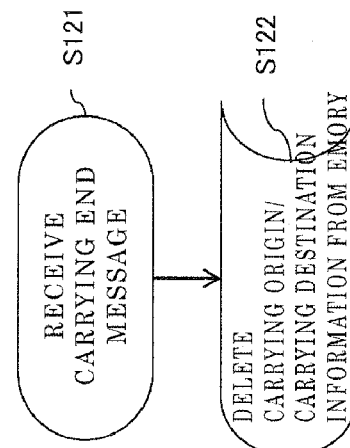
Fig. 6B
Fig. 6C
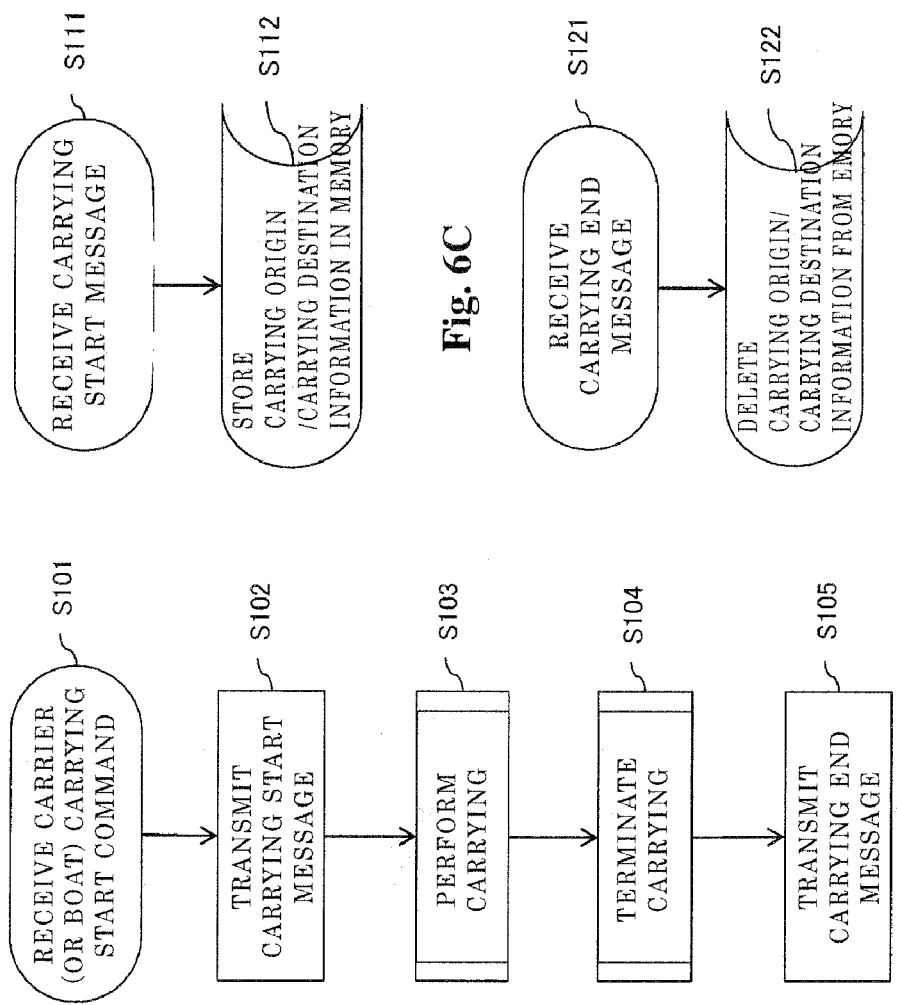
Fig. 6A

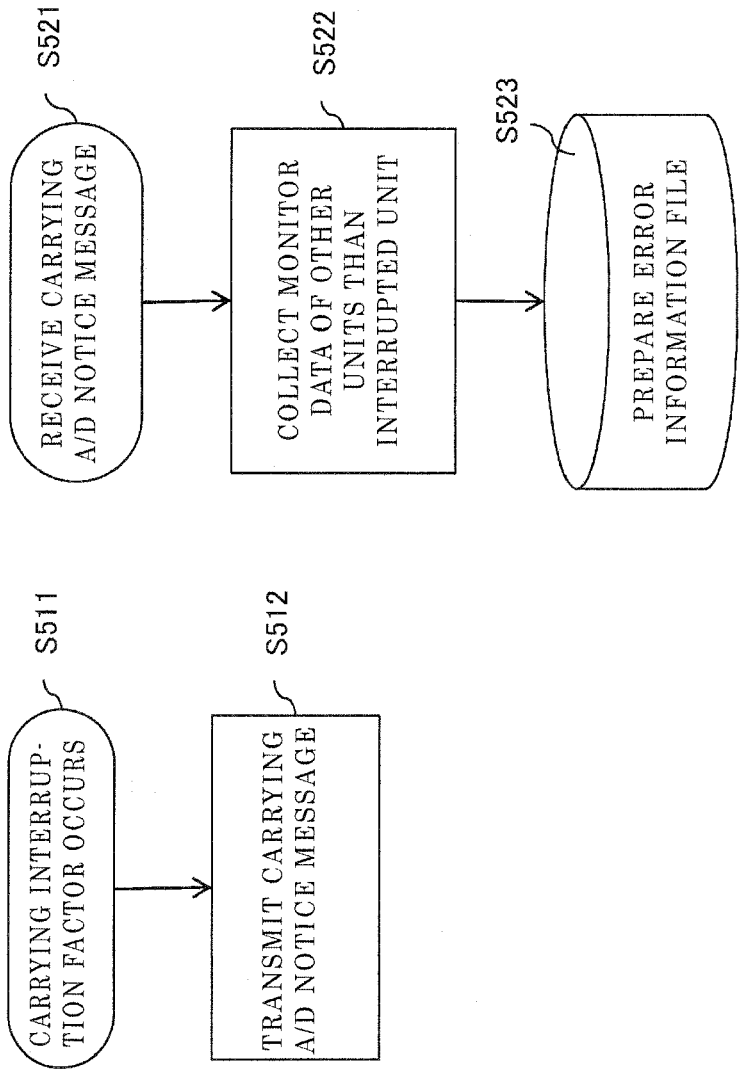

SUBSTRATE PROCESSING APPARATUS AND DISPLAY METHOD FOR SUBSTRATE PROCESSING APPARATUS

CROSS-REFERENCE TO RELATED PATENT APPLICATION

This U.S. non-provisional patent application claims priority under 35 U.S.C. §119 of Japanese Patent Application Nos. 2008-313853, filed on Dec. 10, 2008, and 2009-260498, filed on Nov. 13, 2009, in the Japanese Patent Office, the entire contents of which are hereby incorporated by reference.

BACKGROUND OF THE INVENTION

1. Field of the Invention

The present invention relates to a substrate processing apparatus including a carrying system configured to carry a substrate, a manipulation unit configured to display an operation state of the carrying system on a manipulation screen, and a control unit configured to control an operation of the carrying system, and the present invention relates to a display method for the substrate processing apparatus.

2. Description of the Prior Art

In a conventional substrate processing apparatus, substrates which are process target objects are carried in a state where the substrates are accommodated in a substrate container such as a carrier. The carrier in which the substrates are accommodated is carried by a carrier carrying mechanism along a plurality of carrier arrangement schedule positions provided in the substrate processing apparatus. In addition, the substrates which are process target objects are transferred from the carrier to a substrate holding tool such as a boat, and then the substrates are carried into a process furnace. The boat in which the substrates are held is carried by a boat carrying mechanism along a plurality of boat arrangement schedule positions.

In such a substrate processing apparatus, a carrier or a boat are displayed on a manipulation screen. However, only stationary states of the carrier and the boat are displayed on the manipulation screen, and moving states of the carrier and the boat are not displayed. Therefore, during a carrying operation, it is difficult for an operator to check the current positions, transportation origins, and transportation destinations of carrying systems including the carrier and the boat.

SUMMARY OF THE INVENTION

An object of the present invention is to provide a substrate processing apparatus in which the positions, transportation origins, and transportation destinations of carrying systems including a carrier and a boat can be easily checked, and a display method for the substrate processing apparatus.

According to an aspect of the present invention, there is provided a substrate processing apparatus comprising: a carrying system configured to carry a substrate; a manipulation unit configured to display an operation state of the carrying system on a manipulation screen; and a control unit configured to control a carrying operation of the carrying system, wherein, when the carrying operation of the carrying system is started, the control unit transmits a carrying start message containing information about a transportation origin and a transportation destination of the carrying system to the manipulation unit; when the carrying operation of the carrying system is terminated, the control unit transmits a carrying end message containing carrying end information of the carrying system to the manipulation unit; when the manipulation unit receives the carrying start message, the manipulation unit displays a carrying system icon indicating the carrying system which is a carrying target object and a carrying-out icon at predetermined positions of the manipulation screen corresponding to the transportation origin of the carrying system, and a carrying-in icon at a predetermined position of the manipulation screen corresponding to the transportation destination of the carrying system; and when the manipulation unit receives the carrying end message, the manipulation unit removes the carrying-out icon and the carrying-in icon from the manipulation screen and displays the carrying system icon at a predetermined position of the manipulation screen corresponding to a transportation destination of the substrate.

According to another aspect of the present invention, there is provided a substrate processing apparatus comprising: a carrying system configured to carry substrates; a substrate holding tool included in the carrying system and configured to receive the substrates; a manipulation unit configured to display a carrying state of the substrate holding tool on a manipulation screen; and a control unit configured to control a carrying operation of the carrying system, wherein, when the substrate holding tool starts to be lifted/lowered, the control unit transmits a lifting/lowering start message containing information about a transportation origin and a transportation destination of the substrate holding tool to the manipulation unit; when a lifting/lowering of the substrate holding tool stops, the control unit transmits a lifting/lowering end message containing lifting/lowering end information of the substrate holding tool to the manipulation unit; when the manipulation unit receives the lifting/lowering start message, the manipulation unit displays a direction icon on the manipulation screen to indicate a direction from the transportation origin to the transportation destination of the substrate holding tool; while the substrate holding tool is being lifted/lowered, the manipulation unit moves a carrying system icon indicating the substrate holding tool based on actual positional information in a state where the direction icon is being displayed; and when the manipulation unit receives the lifting/lowering end message, the manipulation unit removes the direction icon from the manipulation screen and stops the carrying system icon indicating the substrate holding tool.

According to another aspect of the present invention, there is provided a display method performed in a substrate processing apparatus including a carrying system configured to carry a substrate, a manipulation unit configured to display an operation state of the carrying system on a manipulation screen, and a control unit configured to control a carrying operation of the carrying system, the display method comprising: (a) starting the carrying operation of the carrying system and transmitting a carrying start message containing information about a transportation origin and a transportation destination of the carrying system from the control unit to the manipulation unit; (b) displaying a carrying system icon indicating the carrying system at a predetermined position of the manipulation screen corresponding to the transportation origin of the carrying system and a carrying-in icon at a predetermined position of the manipulation screen corresponding to the transportation destination of the carrying system when the carrying start message transmitted by the control unit is received by the manipulation unit; (c) terminating the carrying operation of the carrying system and transmitting a carrying end message from the control unit to the manipulation unit; and (d) removing the carrying-out icon and the carrying-in icon from the manipulation screen when the carrying end message transmitted by the control unit is received.

According to another aspect of the present invention, there is provided a display method performed in a substrate processing apparatus including a carrying system configured to carry substrates, a substrate holding tool included in the carrying system and configured to receive the substrates, a manipulation unit configured to display a carrying state of the substrate holding tool on a manipulation screen, and a control unit configured to control a carrying operation of a carrying system, the display method comprising: (a) transmitting a lifting/lowering start message containing an information about a transportation origin and a transportation destination of the substrate holding tool from the control unit to the manipulation unit when the substrate holding tool starts to be lifted/lowered; (b) displaying a direction icon on the manipulation screen to indicate a direction from the transportation origin to the transportation destination of the substrate holding tool when the lifting/lowering start message is received by the manipulation unit; (c) moving a carrying system icon indicating the substrate holding tool based on an actual positional information thereof with the direction icon being displayed on the manipulation screen while the substrate holding tool is being lifted/lowered; (d) transmitting a lifting/lowering end message containing a lifting/lowering end information of the substrate holding tool from the control unit to the manipulation unit when a lifting/lowering of the substrate holding tool stops; and (e) removing the direction icon from the manipulation screen and stopping the carrying system icon indicating the substrate holding tool when the lifting/lowering end message is received by the manipulation unit.

BRIEF DESCRIPTION OF THE DRAWINGS

FIG. 1A to FIG. 1C are schematic views illustrating contents of a manipulation screen of a substrate processing apparatus according to an embodiment, in which FIG. 1A illustrates contents displayed before a carrier is carried, FIG. 1B illustrates contents displayed while the carrier is carried, and FIG. 1C illustrates contents displayed after the carrier is carried.

FIG. 2A to FIG. 2C are schematic views illustrating contents of a manipulation screen of the substrate processing apparatus according to the embodiment, in which FIG. 2A illustrates contents displayed before a boat is carried, FIG. 2B illustrates contents displayed while the boat is carried, and FIG. 2C illustrates contents displayed after the boat is carried.

FIG. 3A and FIG. 3B are schematic views illustrating contents of a manipulation screen of the substrate processing apparatus according to the embodiment, in which FIG. 3A illustrates contents displayed just after the boat is lifted, and FIG. 3B illustrates contents displayed while the boat is lifted.

FIG. 5A and FIG. 5B are schematic views illustrating contents of a manipulation screen of the substrate processing apparatus according to the embodiment, in which FIG. 5A illustrates contents displayed when carrying of a carrier is interrupted, and FIG. 5B illustrates re-display of contents which has originally displayed when carrying of a carrier is interrupted.

FIG. 6A to FIG. 6D are flowcharts for explaining operations of a manipulation unit and a control unit of the substrate processing apparatus according to the embodiment, in which FIG. 6A illustrates an operation flow of the control unit from the receipt of a start command requesting start of carrier and boat carrying operations to the transmission of a carrying end message, FIG. 6B illustrates an operation flow of the manipulation unit when the manipulation unit receives a carrying start message, FIG. 6C illustrates an operation flow of the manipulation unit when the manipulation unit receives the carrying end message, and FIG. 6D illustrates an operation flow of the manipulation unit for displaying a manipulation screen.

FIG. 7A and FIG. 7B are flowcharts for explaining operations of the manipulation unit and control unit of the substrate processing apparatus according to the embodiment, in which FIG. 7A illustrates an operation flow of the manipulation unit for updating the display position of a boat image, and FIG. 7B illustrates an operation flow of the manipulation unit for displaying the carrying direction of the boat.

FIG. 8A to FIG. 8D are flowcharts for explaining operations of the manipulation unit and the control unit of the substrate processing apparatus according to the embodiment, in which FIG. 8A illustrates an operation flow of the control unit when a carrying interruption factor occurs, FIG. 8B illustrates an operation flow of the control unit when an interruption recovery factor occurs, FIG. 8C illustrates an operation flow of the manipulation unit for displaying a carrying allowable/disallowable state, and FIG. 8D illustrates an operation flow of the manipulation unit for displaying a carrying interruption factor list.

FIG. 9A to FIG. 9C are flowcharts for explaining operations of the manipulation unit and the control unit of the substrate processing apparatus according to the embodiment, in which FIG. 9A illustrates an operation flow of the control unit when a carrying interruption factor occurs, and FIG. 9B illustrates an operation flow of the manipulation unit when the manipulation unit receives an error screen re-display request.

DETAILED DESCRIPTION OF THE PREFERRED EMBODIMENTS (1) Structure of Substrate Processing Apparatus A substrate processing apparatus of the current embodiment is configured, for example, as a semiconductor manufacturing apparatus used to perform a substrate processing process in a method of manufacturing a semiconductor device such as an integrate circuit (IC). In addition, the substrate processing apparatus of the current embodiment is configured as a vertical processing apparatus used to perform a process such as an oxidation, diffusion, or chemical vapor deposition (CVD) process.

Figure 10:
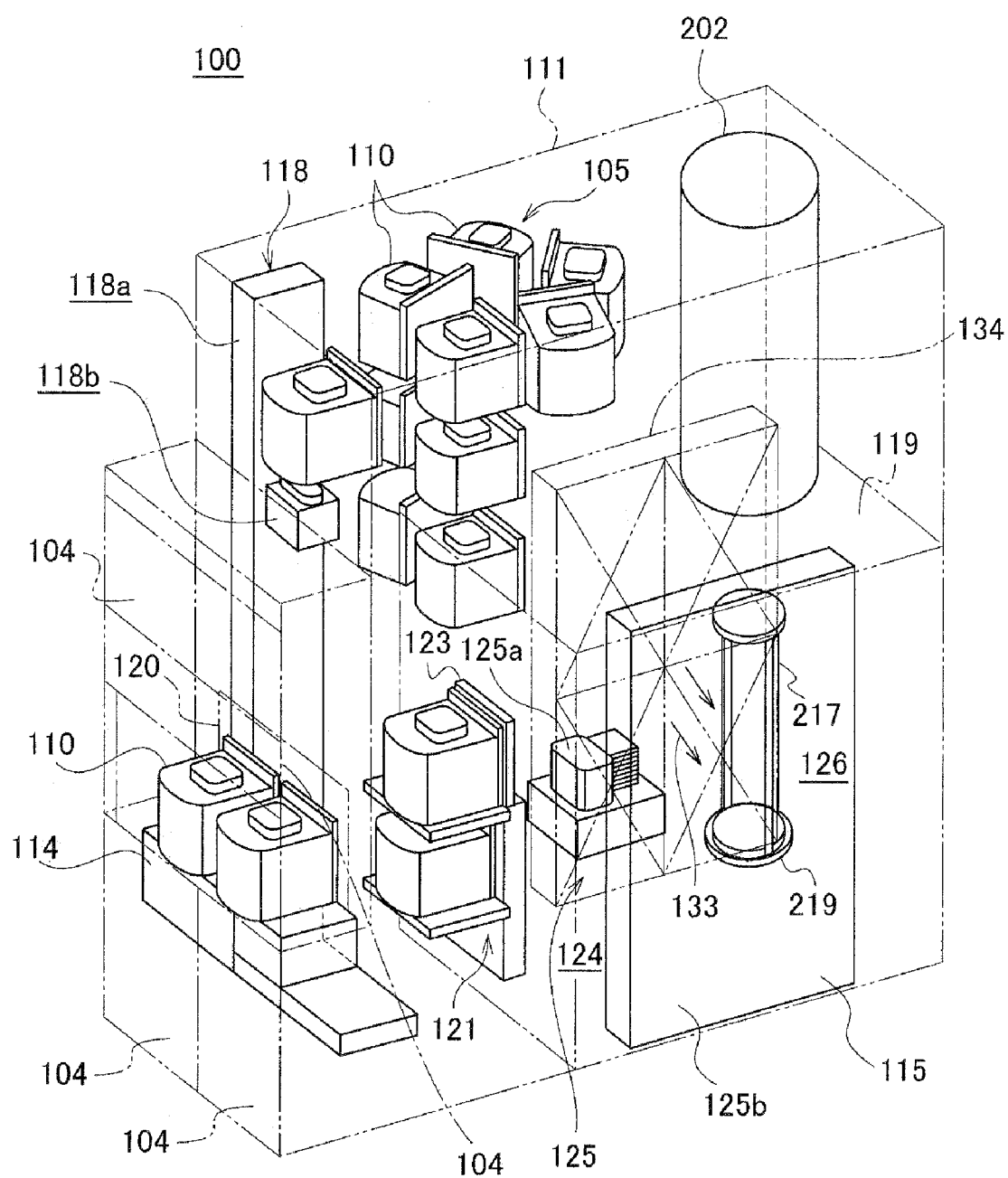
FIG. 10 is a perspective view illustrating the substrate processing apparatus according to the embodiment.
Figure 11:
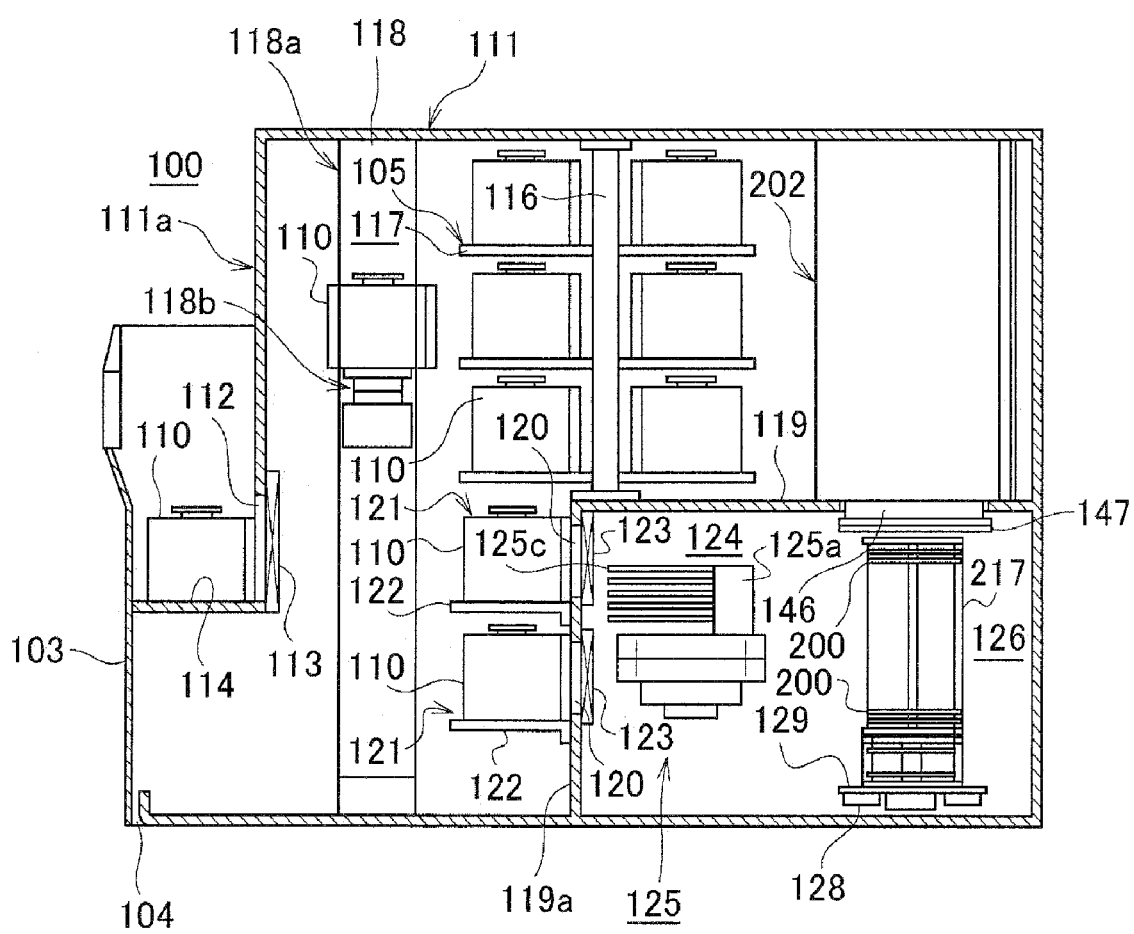
FIG. 11 is a side sectional view illustrating the substrate processing apparatus according to the embodiment.

FIG. 10 is a perspective view illustrating the substrate processing apparatus of the current embodiment. FIG. 11 is a side sectional view illustrating the substrate processing apparatus of FIG. 10.

As shown in FIG. 10 and FIG. 11, according to the current embodiment, the substrate processing apparatus 100 includes a case 111 as a pressure-resistant vessel. At the front side (left in FIG. 11) of a front wall 111a of the case 111, a front maintenance entrance 103 is formed as an opening for maintenance works. At the front maintenance entrance 103, a pair of front maintenance doors 104 is installed for closing and opening the front maintenance entrance 103. To carry substrates such as wafers 200 into and out of the case 111, carriers (pods) 110 capable of accommodating wafers 200 are used as substrate containers.

At the front wall 111a of the case 111, a carrier carrying entrance (substrate container carrying entrance) 112 is formed to connect the inside and outside of the case 111. The carrier carrying entrance 112 is configured to be opened and closed by a front shutter (substrate container carrying entrance opening/closing mechanism) 113. At the front side of the carrier carrying entrance 112, a load port (substrate container stage) 114 is installed. Carrier arrangement schedule positions are provided on the load port 114 to place carriers 110 thereon. The carriers 110 are configured to be adjusted in positions when placed on the load port 114. The carriers 110 are configured to be carried onto the load port 114 from an outside area of the substrate processing apparatus 100 by a carrying system such as an in-process carrying device (not shown).

Near the upper center part of the inside of the case 111 in a front-to-back direction, a rotatable carrier shelf (substrate container shelf) 105 is installed. A plurality of carriers 110 can be stored on the rotatable carrier shelf 105. The rotatable carrier shelf 105 includes a pillar 116 which is vertically installed and intermittently rotatable on a horizontal plane, and a plurality of shelf plates (substrate container stages) 117 which is radially supported at upper, middle, and lower positions of the pillar 116. Carrier arrangement schedule positions are provided on the shelf plates 117 for placing carriers 110 thereon.

At the inside of the case 111 between the load port 114 and the rotatable carrier shelf 105, a carrier carrying device (substrate container carrying device) 118 is installed. The carrier carrying device 118 includes a carrier elevator (substrate container elevating mechanism) 118a capable of moving upward and downward while holding a carrier 110, and a carrier carrying mechanism (substrate container carrying mechanism) 118b capable of moving the carrier elevator 118a horizontally. The carrier carrying device 118 is configured such that a carrier 110 can be carried among the load port 114, the rotatable carrier shelf 105, and carrier openers (substrate container cover opening/closing mechanism) 121 (described later) by continuous operations of the carrier elevator 118a and the carrier carrying mechanism 118b.

At the lower inside part of the case 111, a sub case 119 is installed in a manner such that the sub case 119 extends from about the center part to the rear part in a front-to-back direction. In order to carry wafers 200 into and out of the sub case 119, a pair of wafer carrying entrances (substrate carrying entrances) 120 are formed at a front wall 119a of the sub case 119 in a manner such that the wafer carrying entrances 120 are vertically arranged in a line. At the upper and lower wafer carrying entrances 120, the carrier openers 121 are installed, respectively.

Each of the carrier openers 121 includes a stage 122 and a cap attachment/detachment mechanism (cover attachment/detachment mechanism) 123 configured to attach and detach a cap (cover). A carrier arrangement schedule position is provided on the stage 122 for placing a carrier 110 thereon. Each of the carrier opener 121 is configured to attach and detach a cap of a carrier 110 placed on the stage 122 for closing and opening a wafer taking in/out entrance of the carrier 110.

A transfer chamber 124 is formed in the sub case 119 in a manner such that the transfer chamber 124 is fluidically isolated from a space where parts such as the carrier carrying device 118 and the rotatable carrier shelf 105 are installed. At the front region of the transfer chamber 124, a wafer transfer mechanism (substrate transfer mechanism) 125 is installed as a carrying system. The wafer transfer mechanism 125 includes a wafer transfer device (substrate transfer device) 125a capable of rotating or straightly moving wafers on a horizontal plane, and a wafer transfer device elevator (substrate transfer device elevator) 125b capable of moving the wafer transfer device 125a upward and downward. As shown in FIG. 10, the wafer transfer device elevator 125b is installed between the right end part of the front region of the transfer chamber 124 of the sub case 119 and the right end part of the case 111. The wafer transfer device 125a includes a tweezers (substrate holder) 125c as a stage for placing wafers 200 thereon. By continuous operations of the wafer transfer device elevator 125b and the wafer transfer device 125a, wafers 200 can be charged into a substrate holding tool such as a boat 217 (wafer charging) or discharged from the boat 217 (wafer discharging). The boat 217 is configured to hold a plurality of wafers 200 in a manner such that the wafers 200 are horizontally positioned and stacked in multiple stages.

In the rear region of the transfer chamber 124, a standby section 126 is provided as a boat arrangement schedule position for accommodating the boat 217 in standby state. At the upper side of the standby section 126, a process furnace 202 is installed as a substrate processing system. The bottom side of the process furnace 202 is configured to be closed by a furnace port shutter (furnace opening/closing mechanism) 147.

Although not shown, the substrate processing apparatus 100 includes a plurality of process furnaces 202 and a plurality of boats 217. That is, in the rear region of the transfer chamber 124, a plurality of standby sections 126 are provided as boat arrangement schedule positions where the boats 217 are accommodated in standby state. Each of the boats 217 is configured to be carried among the standby sections 126 by a boat carrying mechanism (not shown).

As shown in FIG. 10, between the right end part of the sub case 119 and the right end part of the case 111, carrying systems such as boat elevators (substrate holding tool elevating mechanisms) 115 configured to lift and lower the boats 217 are installed at the respective process furnaces 202. A connecting tool such as an arm 128 is connected to an elevator base of each of the boat elevators 115. A cover such a seal cap 219 is horizontally attached to the arm 128. A boat arrangement schedule position is provided on the seal cap 219. The seal cap 219 is configured to support the boat 217 vertically from the bottom side of the boat 217 and close the bottom side of the process furnace 202 when the seal cap 219 is lifted.

As shown in FIG. 10, at the left end part of the transfer chamber 124 opposite to the wafer transfer device elevator 125b and the boat elevator 115, a cleaning unit 134 configured by a supply fan and a dust filter is installed so as to supply cleaned atmosphere or inert gas as clean air 133. Between the wafer transfer device 125a and the cleaning unit 134, a notch alignment device (not shown) is installed as a substrate matching device for aligning the circumferences of wafers.

Clean air 133 blown from the cleaning unit 134 flows around the notch alignment device (not shown), the wafer transfer device 125a, and the boat 217 disposed at the standby section 126. Then, the air 133 is sucked through a duct (not shown) and is exhausted to the outside of the case 111, or the air 133 is circulated back to a suction side of the cleaning unit 134, that is, a primary side (supply side) of the cleaning unit 134, so as to be blown back to the transfer chamber 124 by the cleaning unit 134.

Next, an explanation will be given on an operation of the substrate processing apparatus 100 according to the current embodiment with reference to FIG. 10 and FIG. 11.

As shown in FIG. 10 and FIG. 11, when a carrier 110 is supplied to the load port 114, the carrier carrying entrance 112 is opened by moving the front shutter 113. Then, the carrier 110 is carried into the case 111 through the carrier carrying entrance 112 by the carrier carrying device 118.

The carrier 110 carried into the case 111 is automatically carried to the shelf plate 117 of the rotatable carrier shelf 105 by the carrier carrying device 118 and is temporarily stored on the shelf plate 117, and then the carrier 110 is transferred to the stage 122 of one of the carrier openers 121. Alternatively, the carrier 110 carried into the case 111 may be directly transferred to the stage 122 of the carrier opener 121. At this time, the wafer carrying entrance 120 of the carrier opener 121 is closed by the cap attachment/detachment mechanism 123, and clean air 133 is circulated and filled in the transfer chamber 124. For example, nitrogen gas is filled in the transfer chamber 124 as clean air 133 so as to keep the oxygen concentration of the inside of the transfer chamber 124, for example, at 20 ppm or lower, which is much lower than the oxygen concentration of the inside of the case 111 kept at atmosphere.

When the carrier 110 is placed on the stage 122, an opening side of the carrier 110 is pressed by the edge of the wafer carrying entrance 120 of the front wall 119a of the sub case 119, and along with this, the cap of the carrier 110 is detached by the cap attachment/detachment mechanism 123, so that the wafer taking in/out entrance of the carrier 110 can be opened. Thereafter, wafers 200 are picked up from the carrier 110 through the wafer taking in/out entrance of the carrier 110 by the tweezers 125c of the wafer transfer buffer device 125a, and after the orientations of the wafers 200 are aligned by the notch alignment device, the wafers 200 are carried to the standby section 126 located at the rear side of the transfer chamber 124 and charged into the boat 217 (wafer charging). After the wafer transfer device 125a charges the wafers 200 into the boat 217, the wafer transfer device 125a returns to the carrier 110 for charging the next wafers 200 into the boat 217.

While wafers 200 are charged into the boat 217 from the side of one (upper or lower one) of the carrier openers 121 by the wafer transfer mechanism 125, another carrier 110 is concurrently carried to and placed on the stage 122 of the other (lower or upper one) of the carrier openers 121 from the rotatable carrier shelf 105 by the carrier carrying device 118, and the other carrier opener 121 opens the cap of the other carrier 110.

After a predetermined number of wafers 200 are charged into the boat 217, the bottom side of the process furnace 202 closed by the furnace port shutter 147 is opened by moving the furnace port shutter 147. Then, the boat 217 in which the wafers 200 are held is carried to the standby section 126 located at the rear side of the transfer chamber 124 by the boat carrying mechanism (not shown), and is then loaded into the process furnace 202 by lifting the seal cap 219 using the boat elevator 115 (boat loading).

After the loading operation, a predetermined process is performed on the wafers 200 disposed in the process furnace 202. After the process, in approximately the reverse order to the above-described loading order except for the alignment of wafers by the notch alignment device, the boat 217 in which the processed wafers 200 are stored is carried out from the inside (process chamber) of the process furnace 202, and then carriers 110 in which the processed wafers are accommodated are carried out of the case 111.

(2) Structure of Apparatus Controller

Figure 12:
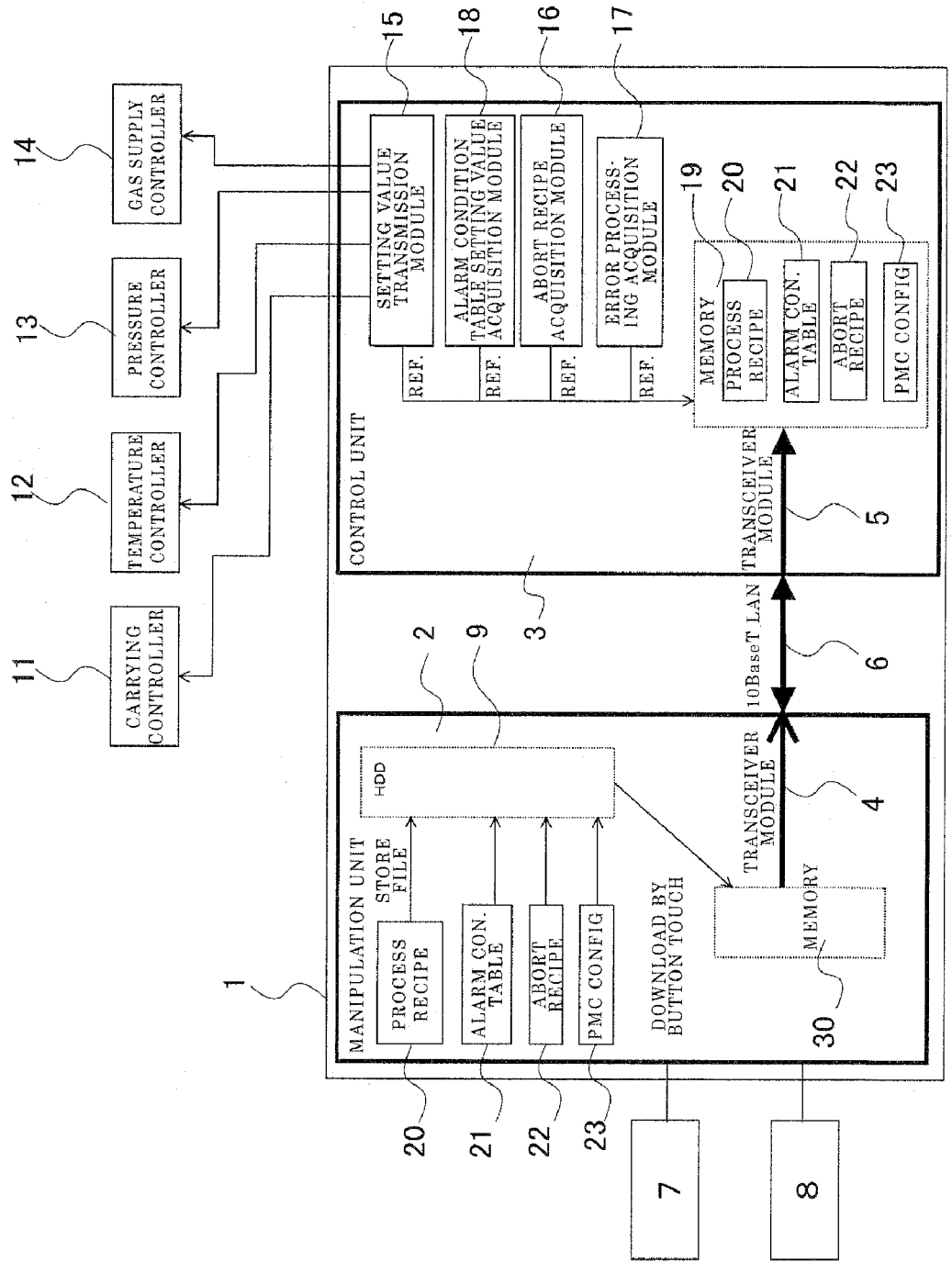
FIG. 12 is a block diagram illustrating a process control module configured to control the substrate processing apparatus according to the embodiment.

FIG. 12 is a block diagram of an apparatus controller 1 functioning as a main controller for controlling each part of the substrate processing apparatus 100. The apparatus controller 1 includes a manipulation unit 2 and a control unit 3.

The manipulation unit 2 is configured by a computer including a CPU, an I/O, a memory 30, a hard disk 9 as a fixed storage unit, and a transceiver module 4. In addition, a monitor 7 providing a manipulation screen, and a key input device 8 are connected to the manipulation unit 2. The hard disk 9 stores a process recipe 20, an alarm condition table 21, an abort recipe 22, and a PMC config file (process module config file) 23. In addition, the hard disk 9 stores various programs necessary for substrate processing or screen display, tables and files necessary for substrate processing, various screen files, and various icon files (these are not shown).

The process recipe 20 is a file for determining a substrate processing sequence. Setting values (control values) to be transmitted to sub controllers (described later) such as a temperature controller, a pressure controller, and a gas supply controller are set in the process recipe 20 for each step of the substrate processing. In addition, an error check sequence for each step is also set in the process recipe 20. In addition, the abort recipe 22 contains a recovery process sequence for each error state (each kind of error) that can be detected by an error check in each step. In addition, the PMC config file (process control module config file) 23 or the alarm condition table 21 contains table numbers for looking up a predetermined recovery sequence corresponding to an error state from the abort recipe 22, and various parameters for controlling the substrate processing apparatus 100. If an error is detected by an error check in each step, table numbers of the PMC config file 23 or the alarm condition table 21 are searched, and by using the searched table numbers, a predetermined recovery sequence is found from the abort recipe 22 for performing a recovery process according to the found recovery sequence.

The control unit 3 is configured by a computer including a CPU, an I/O, a memory 19, and a transceiver module 5. In addition, the transceiver module 5 of the control unit 3 is connected to the transceiver module 4 of the manipulation unit 2 through a LAN 6 (for example, a 10BaseT LAN cable) so that the manipulation unit 2 and the control unit 3 can communicate with each other.

Sub controllers such as a carrying controller 11, a temperature controller 12, a pressure controller 13, and a gas supply controller 14 are connected to the control unit 3. The carrying controller 11 is configured to control carrying operations of devices such as the carrier carrying device 118, the wafer transfer mechanism 125, the boat carrying mechanism, and the boat elevator 115. The temperature controller 12 is configured to adjust the inside temperature of the process furnace 202 by controlling the temperature of a heater (not shown) disposed around the circumference of the process furnace 202. The pressure controller 13 is configured to control the operation of a decompression exhaust device such as a vacuum pump installed at an exhaust pipe used to exhaust the inside of the process furnace 202, and to control the degree of valve opening of a pressure regulating valve. For example, the gas supply controller 14 is configured to control starting and stopping of gas supply, and the supply flowrate of gas through one or more gas supply pipes (not shown) connected to the inside of the process furnace 202. In addition, the carrying controller 11 may be configured by a computer including a CPU, an I/O, a memory, and a transceiver module.

When the apparatus controller 1 starts to operate, the manipulation unit 2 acquires an initial screen (start screen) from the screen files previously stored in the hard disk 9 and displays the initial screen on the monitor 7 as a manipulation screen. The initial screen includes a download button (not shown). If an operator presses the download button of the initial screen by using the key input device 8 (or using his/her finger in the case where a touch key is displayed on the initial screen), the manipulation unit 2 loads the process recipe 20, the alarm condition table 21, the abort recipe 22, the PMC config file 23, and various control programs from the hard disk 9 to the memory 30 and transmits them to the memory 19 of the control unit 3 through the LAN 6.

Those received from the manipulation unit 2 such as the process recipe 20, the alarm condition table 21, the abort recipe 22, and the PMC contig file 23 are stored and retained in the memory 19 of the control unit 3. In addition, the programs transmitted to the memory 19 of the control unit 3 create a setting value transmission module 15, an abort recipe acquisition module 16, an error processing acquisition module 17 embedded in the PMC config file 23, and an alarm condition table setting value acquisition module 18 in the control unit 3. The setting value transmission module 15, the abort recipe acquisition module 16, the error processing acquisition module 17 embedded in the PMC config file 23, and the alarm condition table setting value acquisition module 18 are configured to read various information retained in the memory 19 and transmit the acquired information to corresponding substrate controllers, respectively, so as to progress a substrate processing process or an error recovery process properly.

Along with a substrate processing process, the manipulation unit 2 searches the screen files stored in the hard disk 9 and displays a screen (not shown) on the monitor 7 for performing or preparing a recipe. Various components such as buttons or boxes displayed on the monitor 7 are related with corresponding programs. If a button or box displayed on the monitor 7 is pressed or a key of the key input device 8 is pressed, the CPU of the manipulation unit 2 or the control unit 3 calls a corresponding program and performs a control operation.

(3) Display on Monitor

The manipulation unit 2 is configured to receive various commands (input through the key input device 8) from an operator, which relate to carrying systems such as the carrier carrying device 118, the boat carrying mechanism, and the boat elevator 115. The control unit 3 is configured to control operations of the carrying systems such as the carrier carrying device 118, the wafer transfer mechanism 125, the boat carrying mechanism, and the boat elevator 115 based on the various commands of the operator which are received from the manipulation unit 2 or the process recipe 20 transmitted from the manipulation unit 2. At this time, the manipulation unit 2 is configured such that carrying states of carriers 110 or the boat 217 included in the carrying systems are displayed on the monitor 7 as a manipulation screen. Hereinafter, related display operations will be explained.

<Display of Icons During Carrying-In and Carrying-Out Operations>

First, with reference to FIG. 1A to FIG. 2C, explanations will be given on operations for displaying a carrying-out icon 301 and a carrying-in icon 302 on the monitor 7 (manipulation screen) when a carrier 110 or the boat 217 which is representative of the carrying systems is carried.

Figure 1A:
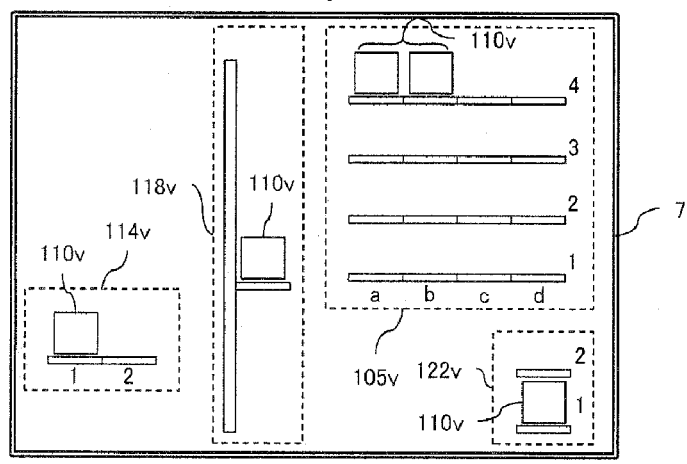
Figure 1B:
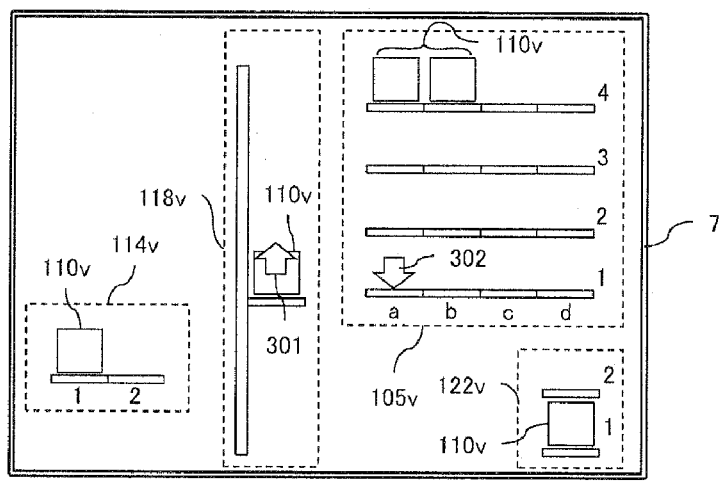
Figure 1C:
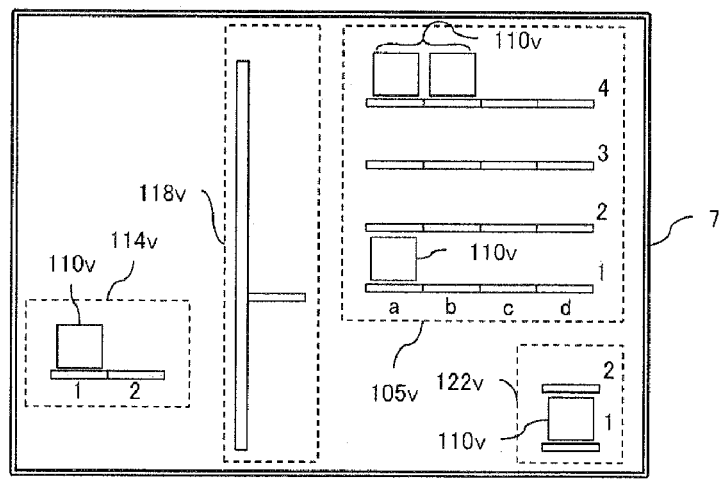
Figure 2A:
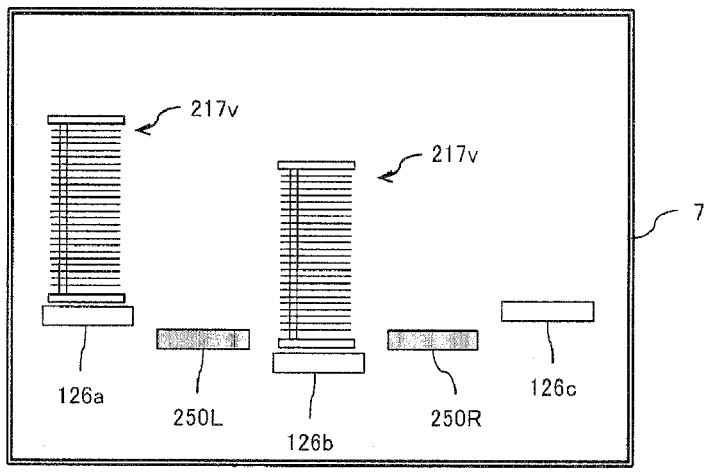
Figure 2B:
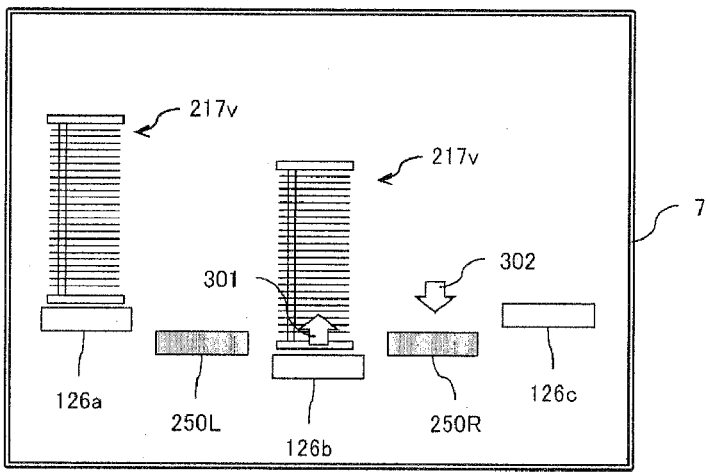
Figure 2C:
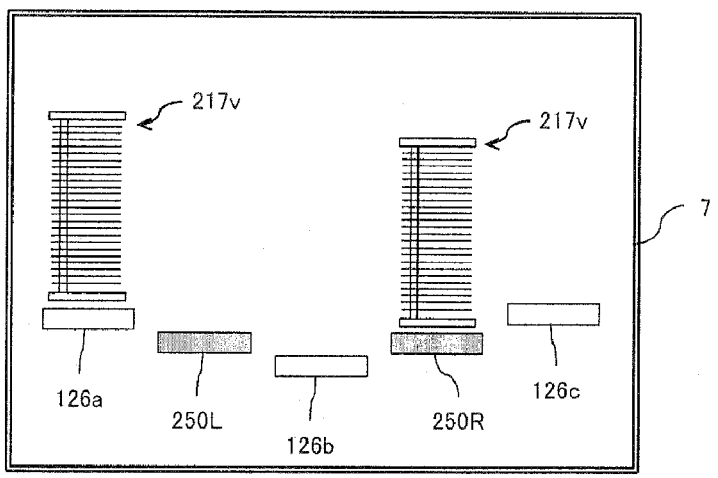

FIG. 1A to FIG. 1C are schematic views illustrating contents displayed on the monitor 7 of the substrate processing apparatus 100, in which FIG. 1A illustrates contents displayed before a carrier 110 is carried, FIG. 1B illustrates contents displayed while the carrier 110 is carried, and FIG. 1C illustrates contents displayed after the carrier 110 is carried. FIG. 2A to FIG. 2C are schematic views illustrating contents displayed on the monitor 7 of the substrate processing apparatus 100, in which FIG. 2A illustrates contents displayed before the boat 217 is carried, FIG. 2B illustrates contents displayed while the boat 217 is carried, and FIG. 2C illustrates contents displayed after the boat 217 is carried.

As shown in FIG. 1A, when a carrier 110 which is a carrying target object is in a pre-carrying state (rest state), images of carrier arrangement schedule position are displayed on the monitor 7: an image (load port image) 114v of the load port 114, an image (carrier carrying device image) 118v of the carrier carrying device 118, an image (rotatable carrier shelf image) 105v of the rotatable carrier shelf 105, and an image (stage image) 122v of the stage 122.

These images may also be referred to as carrying system icons. In addition, images (carrier images) 110v of carriers 110 as carrying system icons are displayed at predetermined positions of the monitor 7 corresponding to arrangement positions of the carriers 110 in the substrate processing apparatus 100. In addition, as shown in FIG. 2A, when the boat 217 is in a pre-carrying state (rest state), boat arrangement schedule position images are displayed on the monitor 7: images (standby section images) 126a to 126c of the standby sections 126, and images (boat carrying mechanism images) 250I, and 250R of boat holding parts of the boat carrying mechanism. These images may also be referred to as carrying system icons. In addition, images (boat images) 217v of the boat 217 as carrying system icons are displayed at predetermined positions of the monitor 7 corresponding to arrangement positions of the boat 217 in the substrate processing apparatus 100.

In addition, as shown in FIG. 1B and FIG. 2B, when the carrier 110 or the boat 217 is in a carrying state (moving state), at a predetermined position of the monitor 7 corresponding to a transportation origin of the carrier 110 or the boat 217, an upward arrow icon 301 is displayed as a carrying-out icon (an image indicating a carrying-out state) to indicate a carrying-out operation from the transportation origin. In addition, at a predetermined position of the monitor 7 corresponding to a transportation destination of the carrier 110 or the boat 217, a downward arrow icon 302 is displayed as a carrying-in icon (an image indicating a carrying-in state) to indicate a carrying-in operation to the transportation destination.

In addition, as shown in FIG. 1C and FIG. 2C, when the carrier 110 or the boat 217 is in a post-carrying state (rest state), the carrier image 110v or the boat image 217v which is a carrying system icon is removed from the predetermined position of the monitor 7 corresponding to the transportation origin of the carrier 110 or the boat 217. In addition, at the predetermined position of the monitor 7 corresponding to the transportation destination of the carrier 110 or the boat 217, the carrier image 110v or the boat image 217v which is a carrying system icon is displayed. The upward arrow icon 301 or the downward arrow icon 302 is removed from the monitor 7 when the carrying systems including the carrier 110 or the boat 217 are in a rest state.

Next, explanations will be given on operations of the manipulation unit 2 and the control unit 3 that are related to display of the upward arrow icon 301 and the downward arrow icon 302 with reference to FIG. 6A to FIG. 6D.

FIG. 6A to FIG. 6D are flowcharts for explaining operations of the manipulation unit 2 and the control unit 3 of the substrate processing apparatus 100 according to the current embodiment, in which FIG. 6A illustrates an operation flow of the control unit 3 from the receipt of a command requesting start of a carrying operation of a carrier 110 or the boat 217 to the transmission of a carrying end message, FIG. 6B illustrates an operation flow of the manipulation unit 2 when the manipulation unit 2 receives a carrying start message, FIG. 6C illustrates an operation flow of the manipulation unit 2 when the manipulation unit 2 receives a carrying end message, and FIG. 6D illustrates a display operation flow of the monitor 7 by the manipulation unit 2.

When a carrying operation start command is input from an operator, for example, through the key input device 8, so as to operate the carrying systems (such as the carrier carrying device 118, the boat carrying mechanism, and the boat elevator 115) for carrying a carrier 110 or the boat 217, the manipulation unit 2 receives the start command and transmits the start command to the control unit 3. As shown in FIG. 6A, the control unit 3 receives the start command from the control unit 3 (S101).

When starting to carry the carrier 110 or the boat 217 by using the carrier carrying device 118, the boat carrying mechanism, and the boat elevator 115, the control unit 3 prepares a "carrying start message" that includes information about a transportation origin and a transportation destination of the carrier 110 or the boat 217 (transportation origin/transportation destination information) and reports the start of carrying operation (start command information), and the control unit 3 transmits the "carrying start message" to the manipulation unit 2 (S102). Then, after carrying the carrier 110 or the boat 217 by using the carrier carrying device 118, the boat carrying mechanism, and the boat elevator 115 (S103), and terminating the carrying operation (S104), the control unit 3 transmits a "carrying end message" including information about the transportation origin and the transportation destination (transportation origin/transportation destination information) and reporting the end of carrying operation (carrying end information) to the manipulation unit 2 (S105). In addition, the control unit 3 transmits a "carrying start message" or "carrying end message" when an carrying operation is started based on the process recipe 20 or the abort recipe 22 as well as when an carrying operation is started according to manipulation of the key input device 8 by an operator.

As shown in FIG. 6B, the manipulation unit 2 receives the "carrying start message" from the control unit 3 (S111). The manipulation unit 2 reads the transportation origin/transportation destination information of the carrier 110 or the boat 217 from the "carrying start message" and stores it in the memory 30 (S112).

As shown in FIG. 6C, the manipulation unit 2 receives the "carrying end message" from the control unit 3 (S121). The manipulation unit 2 deletes the transportation origin/transportation destination information of the carrier 110 or the boat 217 included in the "carrying end message" from the memory 30 (S122).

As shown in FIG. 6D, the manipulation unit 2 that has received the "carrying start message" starts to display the carrying state of the carrier 110 or the boat 217 (S131). The display process is periodically initiated (for example, at intervals of 10 seconds) during a period from the receipt of the "carrying start message" to the receipt of the "carrying end message". In addition, the display process may be initiated in response to a predetermined event (for example, a display update manipulation by an operator using the key input device 8). In addition, the display process is performed at each carrier arrangement schedule position and boat arrangement schedule position (at each display target position).

If the display process is initiated, the manipulation unit 2 refers to the transportation origin/transportation destination information stored in the memory 30 (S132).

In addition, the manipulation unit 2 determines whether a display target position (carrier arrangement schedule position or boat arrangement schedule position) is coincident with the transportation origin specified by the transportation origin/transportation destination information stored in the memory 30 (S133). Then, if the display target position is coincident with the transportation origin specified by the transportation origin/transportation destination information (in the case of "Yes" in S133), as show in FIG. 1B or FIG. 2B, the manipulation unit 2 displays an upward arrow icon 301 as a carrying-out icon at a predetermined position of the monitor 7 corresponding to the transportation origin of the carrier 110 or the boat 217 (S134).

On the contrary, if the display target position is not coincident with the transportation origin specified by the transportation origin/transportation destination information (in the case of "No" in S133), the manipulation unit 2 determines where the display target position is coincident with the transportation destination specified by the transportation origin/transportation destination information (S135). If the display target position is coincident with the transportation destination specified by the transportation origin/transportation destination information (in the case of "Yes" in S135), as shown in FIG. 1B and FIG. 2B, the manipulation unit 2 displays a downward arrow icon 302 as a carrying-in icon at a predetermined position of the monitor 7 corresponding to the transportation destination of the carrier 110 or the boat 217 (S136).

If the display target position is not coincident with any one of the transportation origin and the transportation destination specified by the transportation origin/transportation destination information (in the case of "No" both in S133 and S135), the manipulation unit 2 does not display any of the upward arrow icon 301 and the downward arrow icon 302 at the display target position (S137) and terminates the display process of the related position. Then, after the same process is performed for the next every carrier arrangement schedule position and boat arrangement schedule position (on each display target position) and is repeated identically for all arrangement schedule positions, the display process for a given period is terminated. In addition, the above described carrying end information includes at least positional info tion of the transportation destination. For example, the positional information of the transportation destination may be obtained from detection result data of a sensor.

<Display of Current Position and Carrying Direction of Boat>

Figure 3A:
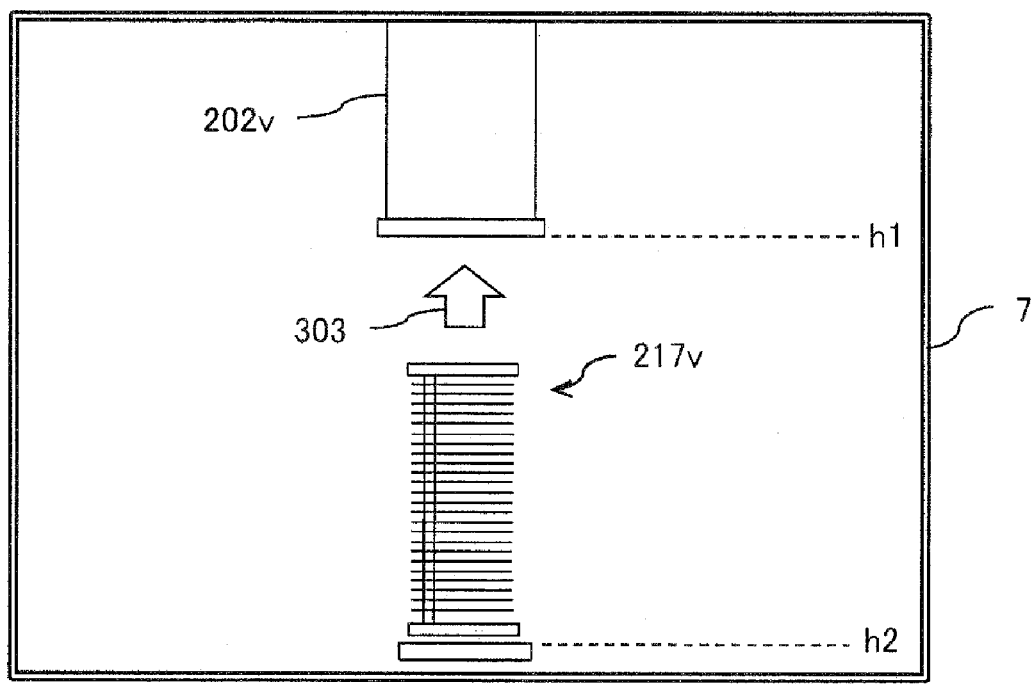
Figure 3B:
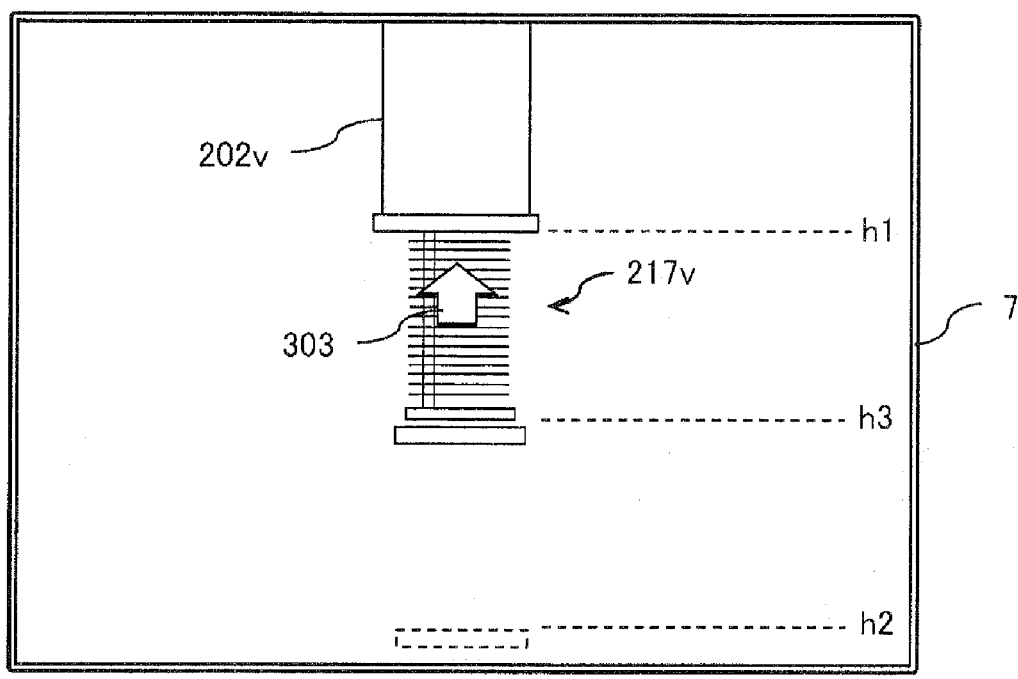

Next, an explanation will be given on an operation for displaying the boat 217 carried into and out of (lifted into and lowered away from) the process furnace 202 by the boat elevator 115 with reference to FIG. 3A and FIG. 3B. FIG. 3A and FIG. 3B are schematic views illustrating contents displayed on the monitor 7 (manipulation screen) of the substrate processing apparatus 100 according to the current embodiment, in which FIG. 3A illustrates contents displayed just after the boat 217 is lifted, and FIG. 3B illustrates contents displayed while the boat 217 is lifted.

As shown in FIG. 3A and FIG. 3B, an image (process furnace image 202*v*) of the process furnace 202, and an image (boat image 217*v*) of the boat 217 as a carrying system icon indicating a carrying system to be carried are displayed on the monitor 7. Here, when the boat 217 which is a carrying target object is being carried, a direction icon such as an arrow icon 303 indicating the carrying direction of the boat 217 is displayed on the monitor 7. In addition, an image of the boat elevator 115 may also be displayed on the monitor 7. Furthermore, images of other components may also be displayed.

The position (height) h3 (mm) of the boat image 217v displayed on the monitor 7 reflects the current position (height) H3 (mm) of the boat 217. In detail, H1 (mm) denotes the maximum height of the boat 217 (at which the boat 217 is loaded in the process furnace 202 for performing a substrate processing process; hereinafter, also referred to as a substrate processing position), H2 (mm) denotes the minimum height of the boat 217 (at which wafers 200 are charged into or discharged from the boat 217; hereinafter, also referred to as a home position), and H3 (mm) denotes the current height of the boat 217. When h1 (mm) and h2 (mm) denote the maximum height and the minimum height of the boat image 217v on the monitor 7, respectively, the current display height h3 of the boat image 217v is determined by the equation of (H1−H3):(H3−H2)=(h1−h3):(h3−h2).

Figure 7A:
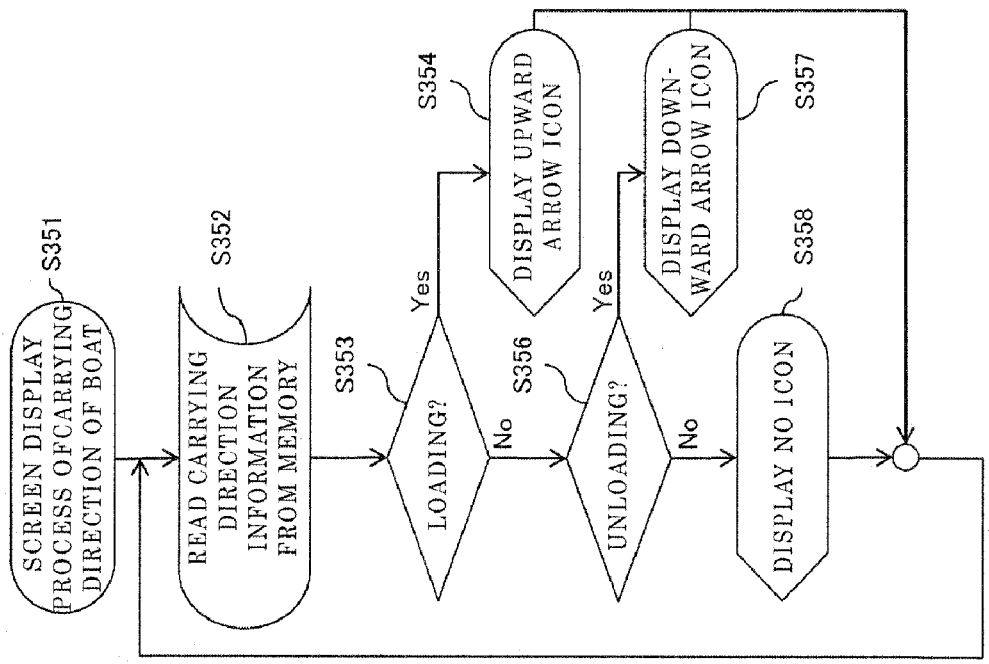
Figure 7B:
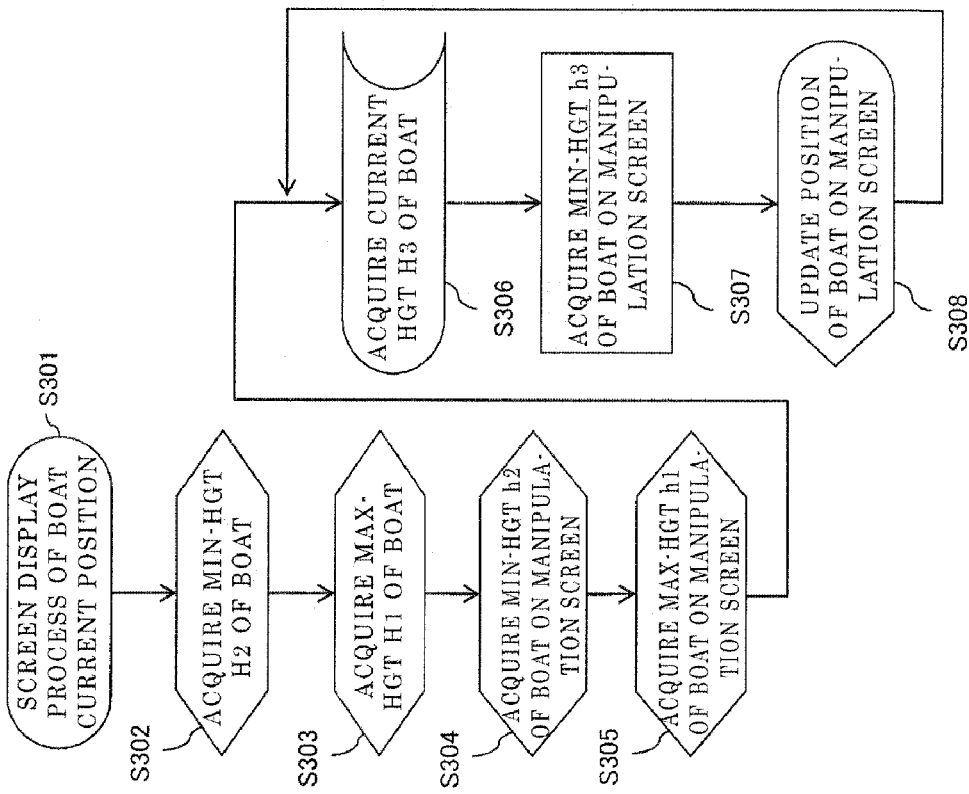

Next, explanations will be given on operations of the control unit 3 and the manipulation unit 2 for displaying a boat image 217v as a carrying system icon, with reference to FIG. 7A and FIG. 7B. FIG. 7A and FIG. 7B are flowcharts for explaining operations of the control unit 3 and the manipulation unit 2 of the substrate processing apparatus 100 according to the current embodiment, in which FIG. 7A illustrates an operation flow of the manipulation unit 2 for updating the display position of a boat image 217v, and FIG. 7B illustrates an operation flow of the manipulation unit 2 for displaying the carrying direction of the boat 217.

As described in FIG. 6A to FIG. 6D, when starting to carry (lift/lower) the boat 217 by using the boat elevator 115, the control unit 3 prepares a "carrying start message" (lifting/lowering start message) and sends the message to the manipulation unit 2. Furthermore, after the carrying operation, the control unit 3 transmits a "carrying end message" (lifting/lowering end message) to the manipulation unit 2. In addition, as described above, the manipulation unit 2 reads transportation origin/transportation destination information of the boat 217 from the received "carrying start message" (lifting/lowering start message) and stores it in the memory 30.

The manipulation unit 2 that has received the "carrying start message" (lifting/lowering start message) starts to display the carrying state of the boat 217 (S301) as shown in FIG. 7A. The display process is periodically initiated (for example, at intervals of 10 seconds) during a period from the receipt of the "carrying start message" (lifting/lowering start message) to the receipt of the "carrying end message" (lifting/lowering end message). In addition, the display process may be initiated (or terminated) in response to a predetermined event (for example, a display update manipulation by an operator using the key input device 8). In addition, information included in the "carrying end message" (lifting/lowering end message) is not limited to positional information of the boat 217. For example, various information such as information about changes can be added to the information included in the "carrying end message" in a load (unload) step.

If a display process starts, the manipulation unit 2 reads the minimum height 1-12 (mm) and the maximum height H1 (mm) of the boat 217 from the hard disk 9 (S302, S303). Next, the manipulation unit 2 reads the minimum height h2 (mm) and the maximum height h1 (mm) of the boat 217 on the monitor 7 from the hard disk 9 (S304, S305). Such information is previously stored in the hard disk 9 as parameter information.

Then, the manipulation unit 2 acquires the current height H3 (mm) of the boat 217 by means of the control unit 3 (S306). The control unit 3 receives information (H3) about the height and position of the boat 217 from a sensor (not shown) installed in the substrate processing apparatus 100 and transmits the information to the manipulation unit 2 in response to a request from the manipulation unit 2.

Then, the manipulation unit 2 calculates the height h3 (mm) of a boat image 217v displayed on the monitor 7 (S307). That is, the manipulation unit 2 determines the display height h3 (mm) of the boat image 217v by the equation of (H1−H3):(H3−H2)=(h1−h3):(h3−h2). Based on the calculated height h3, the manipulation unit 2 updates the position of the boat image 217v displayed on the monitor 7.

In addition, as shown in FIG. 7B, when the boat image 217v is displayed on the monitor 7 as a carrying system icon, the manipulation unit 2 reads the transportation origin/transportation destination information of the boat 217 from the memory 30 so as to determine the carrying direction of the boat 217, and the manipulation unit 2 displays an arrow icon 303 on the monitor 7 as a direction icon indicating the carrying direction of the boat 217. That is, after searching the transportation origin/transportation destination information of the boat 217 read from the memory 30, if it is determined that the transportation origin of the boat 217 is the home position and the transportation destination of the boat 217 is the substrate process position, the manipulation unit 2 determines that the boat 217 is currently loaded (lifted) (S353) and displays an upward arrow icon 303 on the monitor 7 (S354). On the other hand, if the transportation origin of the boat 217 is the substrate processing position and the transportation destination of the boat 217 is the home position, the manipulation unit 2 determines that the boat 217 is currently unloaded (lowered) (S356) and displays a downward arrow icon 303 on the monitor 7 (S357). In addition, if transportation origin/transportation destination information is not set in the memory 30, the manipulation unit 2 determines that the boat 217 is currently stopped. Then, the manipulation unit 2 removes the arrow icon 303 from the monitor 7 (S358) and terminates the display process of the current period. As described above, the display process is initiated at predetermined intervals between the receipt of a "carrying start message" (lifting/lowering start message) and the receipt of a "carrying end message" (lifting/lowering end message). The "carrying end message" (lifting/lowering end message) includes at least transportation destination information, and it is preferable that information about transition from the load (unload) step to another step may be included in the "carrying end message" (lifting/lowering end message).

<Operation in the Case of Carrying Interruption>

Figure 4:
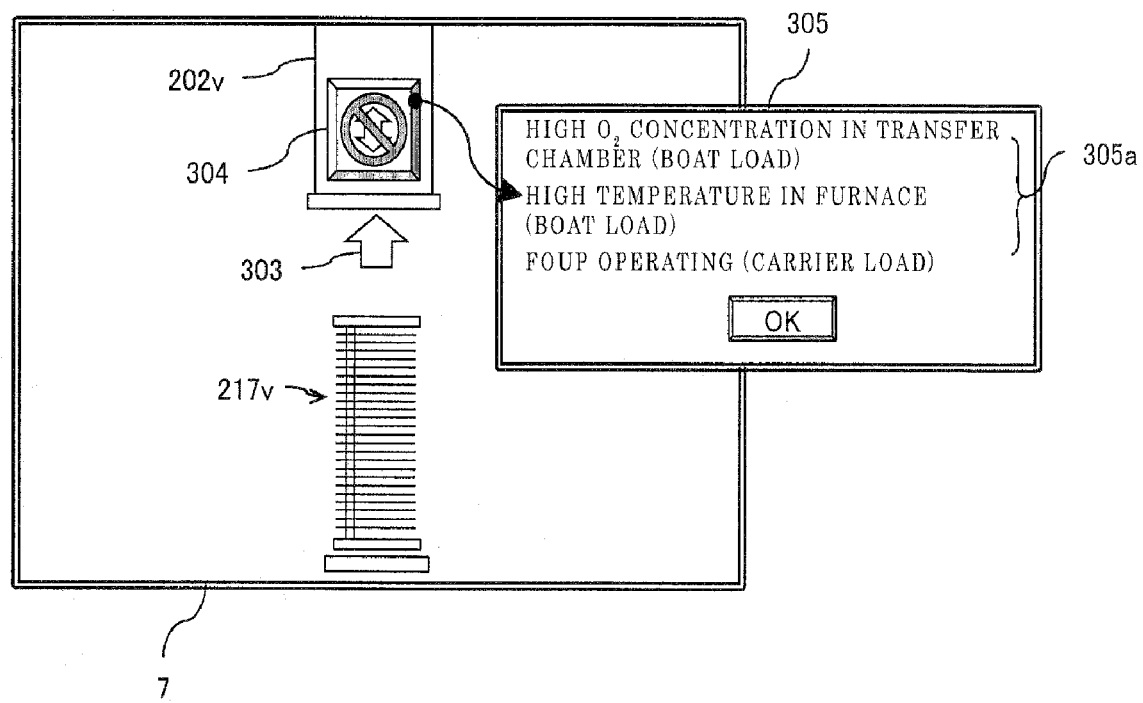
FIG. 4 is a schematic view illustrating contents of a manipulation screen of the substrate processing apparatus according to the embodiment, which are displayed when carrying of the boat is interrupted.

Next, with reference to FIG. 4, an explanation will be given on a display operation in the case where carrying of the boat 217 by means of devices such as the carrier carrying device 118, the boat carrying mechanism, and the boat elevator 115 is restrained. FIG. 4 is a schematic view illustrating contents displayed on the monitor 7 (manipulation screen) of the substrate processing apparatus 100 according to the current embodiment. FIG. 4 illustrates contents displayed when the transfer of the boat 217 is suspended.

As shown in FIG. 4, a carrying operation may be interrupted due to a carrying error if there is a factor restraining a carrying operation, such as fault of carrying systems such as the carrier carrying device 118, the boat carrying mechanism, and the boat elevator 115, improper temperature conditions of a transportation destination (a high temperature condition at the inside temperature of the process furnace 202 or the transfer chamber 124), or improper surrounding gas concentration (high $O_2$ concentration at the inside of the process furnace 202 or the transfer chamber 124). If there is an attempt to operate a carrying system when a carrying operation is interrupted, a carrying interruption icon 304 is displayed at a predetermined position of the monitor 7. In addition, while the carrying interruption icon 304 is displayed, if the carrying interruption icon 304 is pressed by a manipulation of an operator using the key input device 8, a carrying interruption dialogue window 305 including an interruption factor list text 305a that indicates disallowable reasons of current carrying is displayed on the monitor 7. In addition, the carrying interruption icon 304 may be displayed concurrently when a carrying error occurs.

In addition, when the carrying interruption icon 304 is displayed at a predetermined position of the monitor 7, it is configured to not receive but reject a carrying start command that is input through, for example, the key input device 8 to operate the carrier carrying device 118, the boat carrying mechanism, and the boat elevator 115.

Next, with reference to FIG. 8A to FIG. 9C, explanations will be given on operations of the control unit 3 and the manipulation unit 2 in the case where it is not allowed to carry a carrying target object such as a carrier 110 or the boat 217 by using the boat elevator 115, the boat carrying mechanism, and the carrier carrying device 118.

Figure 8D:
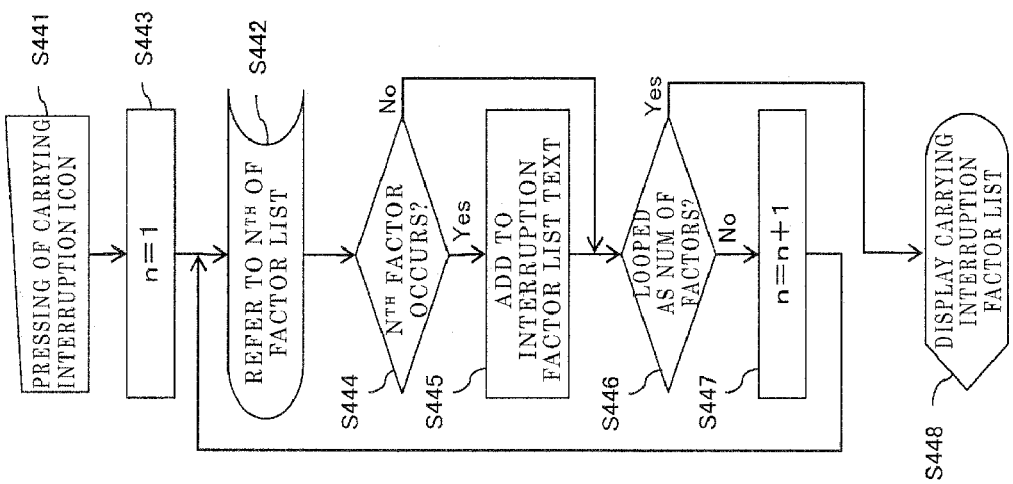
Figure 8C:
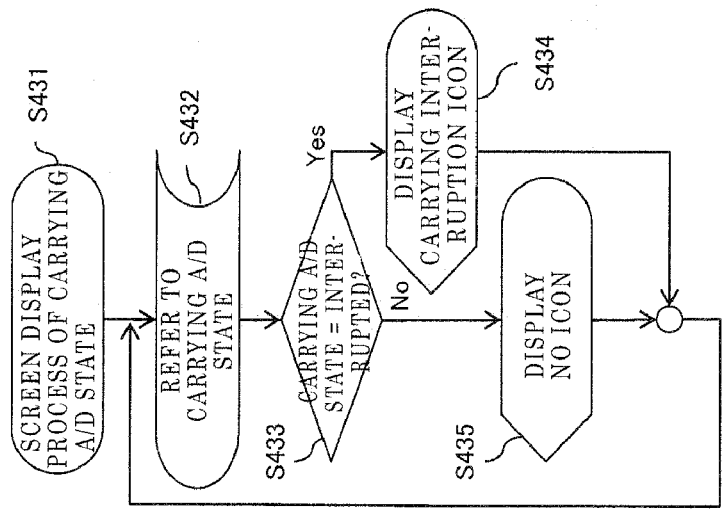
Figure 8A:
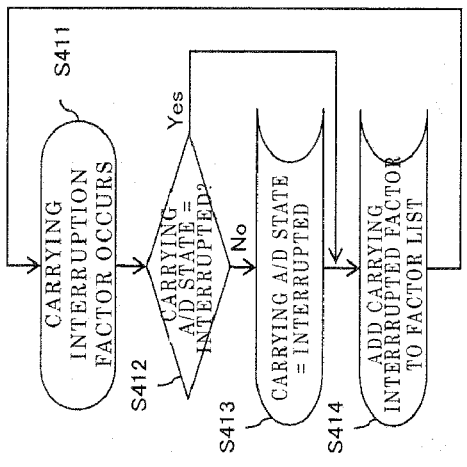
Figure 8B:
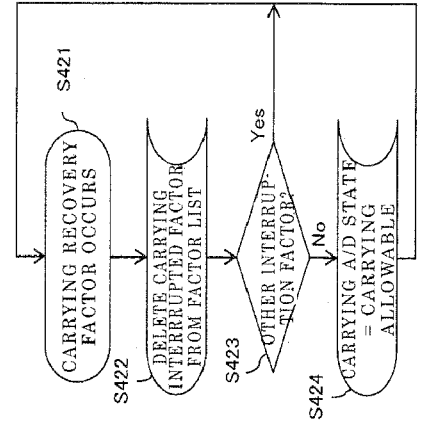

FIG. 8A to FIG. 8D are flowcharts for explaining operations of the manipulation unit 2 and the control unit 3 of the substrate processing apparatus 100 according to the current embodiment, in which FIG. 8A illustrates an operation flow of the control unit 3 when a carrying interruption factor occurs, FIG. 8B illustrates an operation flow of the control unit 3 when a carrying recovery factor occurs, FIG. 8C illustrates an operation flow of the manipulation unit 2 for displaying a carrying operation allowable/disallowable state, and FIG. 8D illustrates an operation flow of the manipulation unit 2 for displaying a carrying interruption factor list.

The control unit 3 maintains a region of the memory 19 where information (carrying allowable/disallowable flag) indicating a carrying allowable/disallowable state is stored and a region of the memory 19 where a carrying interruption factor list (factor list) is stored. In a carrying allowable state, the carrying allowable/disallowable flag has a value of "carrying allowable", and in a carrying interruption state, the carrying allowable/disallowable flag has a value of "interrupted". The factor list includes a pair of a "factor ($n^{th}$ factor) causing a carrying disallowable state" and a "information indicating whether the factor ($n^{th}$ factor) occurs currently". If there occurs a carrying interruption factor or a carrying recovery factor of a carrying system such as a carrier 110 or the boat 217 which is a carrying target object, the control unit 3 performs various processes as described below.

As shown in FIG. 8A, for example, if there is a carrying interruption factor such as fault of a carrying system (the carrier carrying device 118, the boat carrying mechanism, or the boat elevator 115), improper temperature conditions of a transportation destination (a high temperature condition at the inside temperature of the process furnace 202 or the transfer chamber 124), or improper surrounding gas concentration (high $O_2$ concentration at the inside of the process furnace 202 or the transfer chamber 124) (S411), the control unit 3 checks the value of a carrying allowable/disallowable flag stored in the memory 19 (S412). If the value of the carrying allowable/disallowable flag is "carrying allowable" (in the case of "No" in S412), the control unit 3 is configured to change the carrying allowable/disallowable state to "interrupted" (S413), add a carrying interruption factor to the factor list of the memory 19 (S414), prepare a "carrying allowable/disallowable notice message" containing the value of the carrying allowable/disallowable flag and contents of the factor list, send the "carrying allowable/disallowable notice message" to the manipulation unit 2, and wait for occurrence of a next carrying interruption factor or carrying recovery factor.

On the other hand, if the value of the carrying allowable/disallowable flag is "interrupted" (in the case of "Yes" in S412), the control unit 3 is configured to do not change the carrying allowable/disallowable state from "interrupted" (S413 is not performed), add a carrying interruption factor to the factor list of the memory 19 (S414), prepare a "carrying allowable/disallowable notice message" as described above, send the "carrying allowable/disallowable notice message" to the manipulation unit 2, and wait for occurrence of a next carrying interruption factor or carrying recovery factor. In addition, if the manipulation unit 2 receives the "carrying allowable/disallowable notice message", the manipulation unit 2 reads the carrying allowable/disallowable flag and factor list and stores them in the memory 30.

In addition, as shown in FIG. 8B, if a carrying recovery factor occurs (S421), the control unit 3 deletes a corresponding carrying-interruption factor from the factor list of the memory 19 (S422). Then, the control unit 3 checks whether there is any other carrying interruption factor in the factor list of the memory 19. If there is no other carrying interruption factor (in the case of "No" in S423), the control unit 3 is configured to change the carrying allowable/disallowable state of the memory 19 to "carrying allowable", prepare a "carrying allowable/disallowable notice message" as described above, send the "carrying allowable/disallowable notice message" to the manipulation unit 2, and wait for occurrence of a next carrying interruption factor or carrying recovery factor. On the other hand, if there is any other carrying interruption factor (in the ease of "Yes" in S423), the control unit 3 is configured to do not change the carrying allowable/disallowable state from "interrupted" (S424 is not performed), prepare a "carrying allowable/disallowable notice message" as described above, send the "carrying allowable/disallowable notice message" to the manipulation unit 2, and wait for occurrence of a next carrying interruption factor or carrying recovery factor. In addition, if the manipulation unit 2 receives the "carrying allowable/disallowable notice message", the manipulation unit 2 reads the carrying allowable/disallowable flag and factor list and stores them in the memory 30.

As shown in FIG. 8C, the manipulation unit 2 performs a screen display process for displaying a current allowable/disallowable state (S431). The display process is periodically initiated (for example, at intervals of 10 seconds). In addition, the display process may be initiated in response to a predetermined event (for example, in response to a "carrying allowable/disallowable notice message" received from the control unit 3).

If the display process is initiated, the manipulation unit 2 refers to the value of the carrying allowable/disallowable flag stored in the memory 30 (S432). If the value of the carrying allowable/disallowable flag is "interrupted" (in the case of "Yes" in S433), the manipulation unit 2 displays a carrying interruption icon 304 at a predetermined position of the monitor 7 to indicate a carrying interruption state (S434) and terminates the display process of the current period. In the value of the carrying allowable/disallowable flag is "carrying allowable" (in the case of "No" in S433, the manipulation unit 2 removes a carrying interruption icon 304 displayed on the monitor 7 (S435) and terminates the display process of the current period.

As shown in FIG. 8D, while the carrying interruption icon 304 is displayed, if the carrying interruption icon 304 is pressed by a manipulation of an operator using the key input device 8 (S441), the manipulation unit 2 checks occurrence of the respective carrying interruption factors included in the factor list and prepares an interruption factor list text 305a. In detail, for sequential checking from the first factor, the manipulation unit 2 is configured to set n=1 (S442), refer to the $n^{th}$ factor of the factor list (S443), and check whether the $n^{th}$ factor occurs currently (S444). If the $n^{th}$ factor occurs currently (in the case of "Yes" in S444), the manipulation unit 2 adds the factor to the interruption factor list text 305a (S445), and if the $n^{th}$ factor does not occur currently (in the case of "No" in S444), the manipulation unit 2 does not add the factor to the interruption factor list text 305a. Thereafter, the manipulation unit 2 determines whether the $n^{th}$ factor is the last factor of the factor list (whether it is looped as many times as the number of all factors) (S446). If the $n^{th}$ factor is not the last factor (in the case of "No" in S446), n is increased (S447), and the steps next to S442 are repeated, and if the $n^{th}$ factor is the last factor (in the case of "Yes" in S446), the preparation of the interruption factor list text 305a is terminated (S448). Thereafter, the manipulation unit 2 displays a carrying interruption dialogue window 305 on the monitor 7 and displays the interruption factor list text 305a in the carrying interruption dialogue window 305.

Figure 5A:
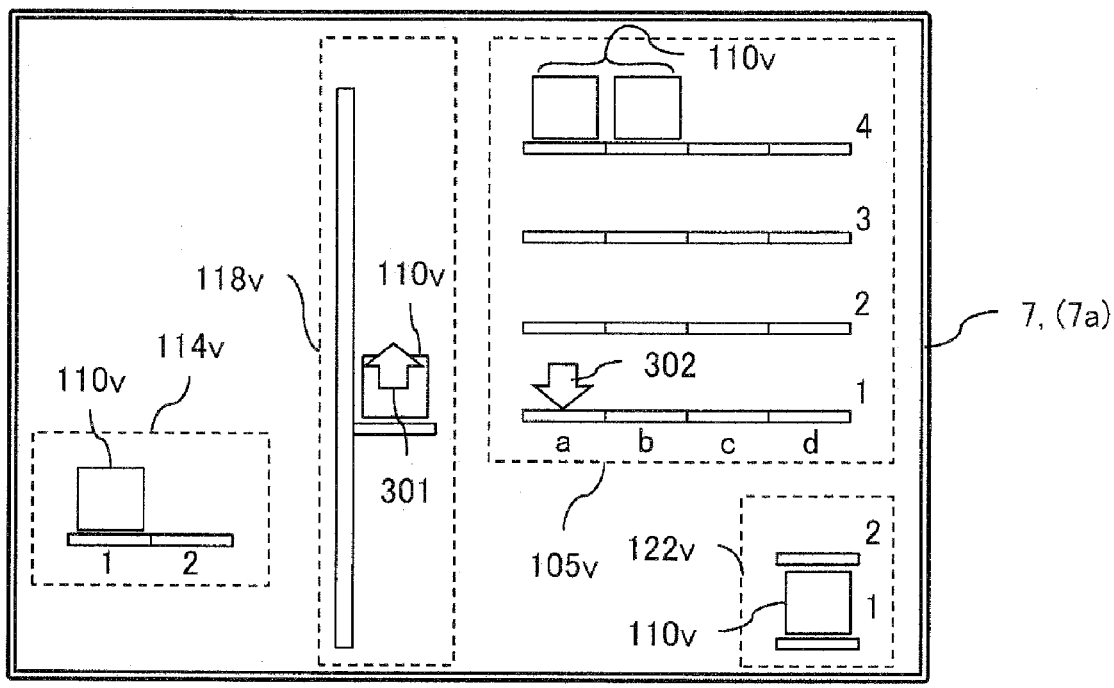
Figure 5B:
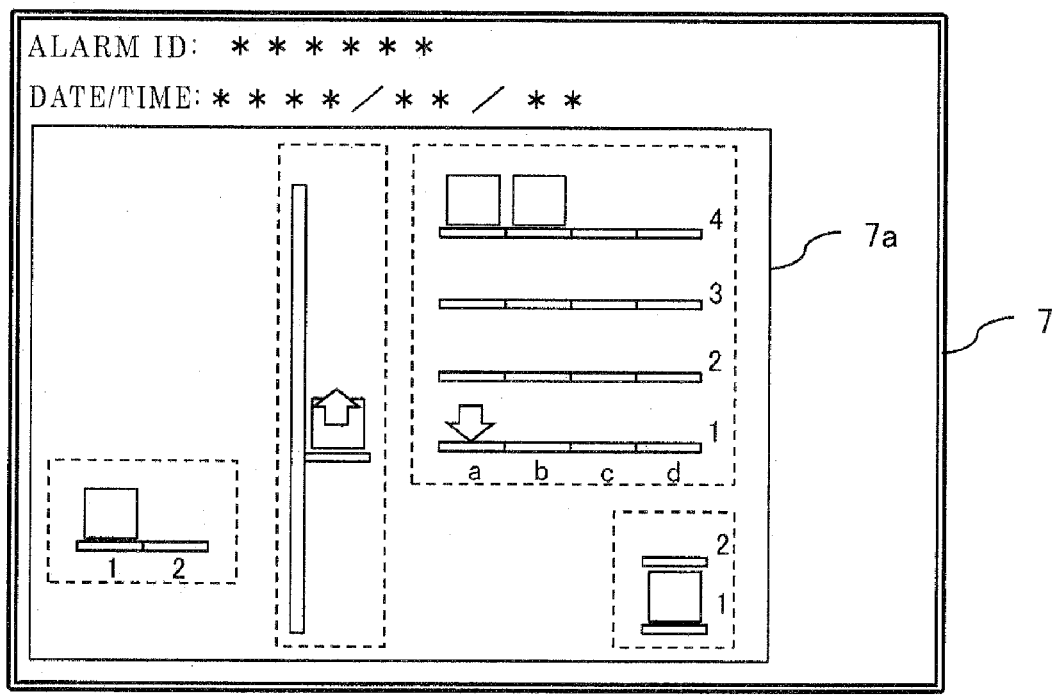

FIG. 5A and FIG. 5B area schematic views illustrating contents displayed on the monitor 7 of the substrate processing apparatus 100 according to the current embodiment, in which FIG. 5A illustrates contents displayed on the monitor 7 when carrying of a carrier is interrupted, and FIG. 5B illustrates re-display of contents which has originally displayed when carrying of a carrier is interrupted. If there is an error when a carrier 110 or the boat 217 is carried by, for example, the carrier carrying device 118, the boat carrying mechanism, and the boat elevator 115, as shown in FIG. 5A, a "display screen displayed on the monitor 7 when the error occurs" is stored in the hard disk 9 as an interruption screen 7a, and if an operator inputs an re-display request through the key input device 8, the interruption screen 7a is reduced and is re-displayed on the monitor 7 as shown in FIG. 5B.

In addition, FIG. 9A to FIG. 9C are flowcharts for explaining operations of the manipulation unit 2 and the control unit 3 of the substrate processing apparatus 100 according to the current embodiment, in which FIG. 9A illustrates a operation flow of the control unit 3 when a carrying interruption factor occurs, and FIG. 9B illustrates an operation flow of the manipulation unit 2 when the manipulation unit 2 receives an error screen re-display request.

As shown in FIG. 9A, if there is an error on carrying systems including a carrier 110 and the boat 217 which is a carrying target object (S511), the control unit 3 prepares a "error notice message" (a) arm generation notice message) including a carrying allowable/disallowable flag value and a factor list and/or transportation origin/transportation destination information, and the control unit 3 sends the "error notice message" to the manipulation unit 2 (S512).

As shown in FIG. 9B, when the manipulation unit 2 receives the "error notice message", the manipulation unit 2 checks the contents of the "error notice message" and collects monitor data that indicate states of other units (in the inside of the apparatus controller 1 or the manipulation unit 2) than the carrying system unit (one of the carrier carrying device 118, the boat carrying mechanism, and the boat elevator 115) (S522). Then, the manipulation unit 2 prepares an error information file including the contents of the "error notice message" and the collected monitor data and stores the error information file in the hard disk 9 (S523). In addition, index information such as an alarm ID or an error occurrence date is included in the error information file so that information can be easily searched from the hard disk 9.

As shown in FIG. 9C, when an operator designates an error information file by using index information such as an alarm ID or an error occurrence date and requests display of an interruption screen 7a, the manipulation unit 2 receives the request (S531). Then, the manipulation unit 2 searches error information files from the hard disk 9 by using the index information input by the operator (S532), refers to the contents of the searched error information file (S533), and reduces and re-displays a screen that has originally displayed when an error occurs by using monitor data included in the error information file to display the screen on the monitor 7 (S534).

Hereinafter, an explanation will be given on the structure of a substrate processing system according to a modification example of the current embodiment.

Figure 13:
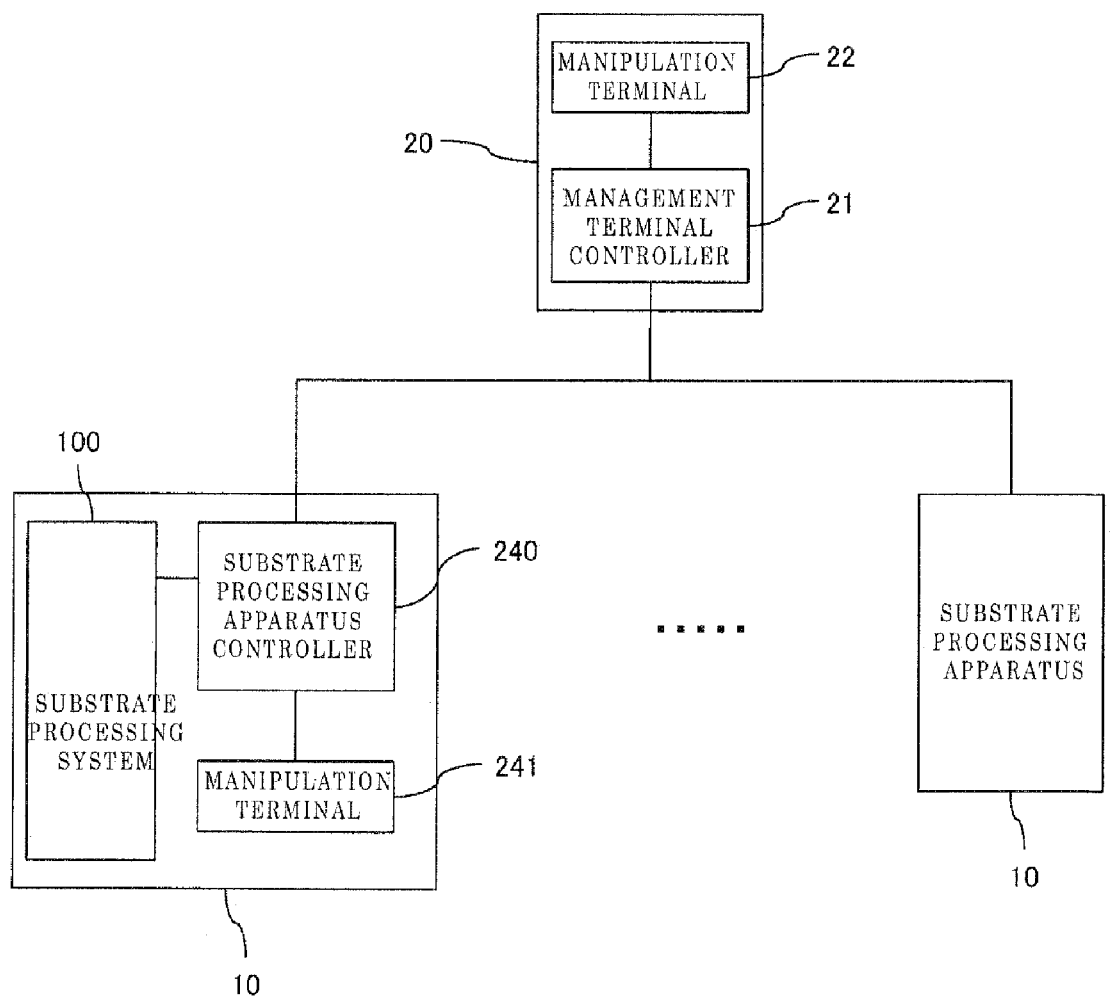
FIG. 13 is a block diagram illustrating the structure of a substrate processing system according to a modification example of the embodiment.

FIG. 13 is a block diagram illustrating the structure of a substrate processing system according to a modification example of the current embodiment. The substrate processing system illustrated in FIG. 13 includes at least one substrate processing apparatus 10 configured to process a wafer 200, and a management apparatus 20 connected to the substrate processing apparatus 10. The substrate processing apparatus 10 and the management apparatus 20 may be connected to each other by means of a communication cable, a network connection via a premises line, or a network connection via a wide area line such as an internet or private line. In addition, the substrate processing apparatus 10 includes a substrate processing unit 100 configured to process a wafer 200, a substrate processing apparatus controller 240 connected to the substrate processing unit 100, and a management terminal 241 connected to the substrate processing apparatus controller 240. The management apparatus 20 includes a management apparatus controller 21 connected to the substrate processing apparatus 10, for example, through a network, and a manipulation terminal 22 which is an input/output device connected to the management apparatus controller 21 so that a user (maintenance worker) can use the manipulation terminal 22 when manipulating the management apparatus 20.

It is not necessary to dispose the management apparatus 20 on the same floor (clean room) where the substrate processing apparatus 10 is disposed. For example, the management apparatus 20 may be connected to an LAN and disposed in an office.

In the current modification example, owing to the above-described structure of the substrate processing system, when an error occurs during a carrying operation of a carrier 110 or the boat 217, a manipulation screen displayed at the carrying time can be stored in a state where arrows indicating positions of a transportation origin and a transportation destination are included in the manipulation screen, and the manipulation screen can be transmitted to the management apparatus 20 as an error information file. Therefore, although an error occurs in the middle of a carrying operation, since a manipulation screen displayed at the time of error occurrence is stored intact in a transmitting file, a position at which the error has occurred can be easily detected. In addition, when the factor of the error is analyzed, since the manipulation screen displayed at the time of error occurrence is stored intact, conditions of the error occurrence time can be easily caught by means of the management apparatus 20 which is spaced apart from the substrate processing apparatus 10.

If an error is a slight one, and a processing process may be continued after removing the error, the above described operations are terminated as the apparatus operates normally. Thereafter, if there is a defect (NG) on a processed substrate (for example, a film thickness defect), data stored in the substrate processing apparatus 10 are analyzed. In the data analysis, an alarm history (error information) of substrate processing is looked up so as to check detailed operation conditions at the time of alarm generation. If an NG is confirmed in a later process (for example, an inspection process using a film thickness detection device or an inspection device), operation conditions at alarm generation time may be easily checked because the reason of the NG may be investigated generally only after several days. However, if an NG is confirmed in a property inspection process performed after a device is manufactured, operation conditions at alarm generation time may be checked after several months. In this case, since a manipulation screen displayed at the time of error occurrence is stored intact according to the modification example of the current embodiment, operation conditions at alarm generation time may be easily checked regardless of the time elapsed from the processing process of a wafer 200, and an alarm that has affected a substrate processing process can be easily found. For example, if an alarm is generated during a boat load operation, the position of the boat 217 when the alarm is generated can be instantly detected to check whether a wafer 200 is loaded in a furnace at that time, and in this way, it can be immediately analyzed that the alarm has influence on substrate processing.

Furthermore, in the current modification example, an error information file may be transmitted to the management apparatus 20 after the file is first stored in the substrate processing apparatus controller 240 of the substrate processing apparatus 10 where an error occurs, or the error information file may be directly transmitted to the management apparatus controller 21 of the management apparatus 20. That is, the present invention is not limited thereto.

(4) Effects of the Current Embodiment

According to the current embodiment, one or more of the following effects can be attained.

According to the current embodiment, when a carrier 110 or the boat 217 is in a carrying state (moving state), a upward arrow icon 301 is displayed as a carrying-out icon (an image indicating that a carrying-out operation is currently performed) at a predetermined position of the monitor 7 corresponding to a transportation origin of the carrier 110 or the boat 217. In addition, a downward arrow icon 302 is displayed as a carrying-in icon (an image indicating that a carrying-in operation is currently performed) at a predetermined position of the monitor 7 corresponding to a transportation destination of the carrier 110 or the boat 217. Furthermore, when the carrier 110 or the boat 217 is in a pre-carrying state (rest state) or post-carrying state (rest state), the upward arrow icon 301 and the downward arrow icon 302 are not displayed on the monitor 7. Therefore, an operator can easily catch the transportation origin and transportation destination of the carrier 110 or the boat 217 when the carrier 110 or the boat 217 is carried. In addition, since the transportation origin and transportation destination of the carrier 110 or the boat 217 are displayed on the monitor 7, an operator can easily catch the current position of the carrier 110 or the boat 217.

According to the current embodiment, when the boat 217 is carried into and out of the process furnace 202 by the boat elevator 115, an arrow icon 303 is displayed on the monitor 7 to indicate the carrying direction of the boat 217. In addition, the position (height) h3 (mm) of a boat image 217v displayed on the monitor 7 reflects the current position (height) H3 (mm) of the boat 217. Therefore, an operator can easily grasp the current position of the boat 217 and the progress of carrying operation.

According to the current embodiment, when starting to carry the boat 217 which is a carrying system, the control unit 3 prepares a "carrying start message" and transmits the "carrying start message" to the manipulation unit 2. When the manipulation unit 2 receives the "carrying start message", the manipulation unit 2 starts to perform a display process for displaying the carrying state of a carrier 110 or the boat 217. The display process is periodically initiated (for example, at intervals of 10 seconds) during a period from the receipt of the "carrying start message" to the receipt of a "carrying end message". In this way, the carrying state of the carrier 110 or the boat 217 displayed on the monitor 7 can be automatically updated, and thus an operator can be less burdened with monitoring work. In addition, the display process may be initiated in response to a predetermined event (for example, a display update manipulation by an operator using the key input device 8) so that the latest carrying position of the carrier 110 or the boat 217 can be easily caught.

According to the current embodiment, when a carrying operation of a carrier 110 or the boat 217 is interrupted, a carrying interruption icon 304 is displayed on a predetermined position of the monitor 7. In addition, while the carrying interruption icon 304 is displayed, if the carrying interruption icon 304 is pressed by a manipulation of an operator using the key input device 8, a carrying interruption dialogue window 305 including an interruption factor list text 305a that indicates disallowable reason(s) of current carrying is displayed on the monitor 7. Therefore, an operator can easily grasp the carrying state of the carrier 110 or the boat 217 or carrying interruption reason(s).

According to the current embodiment, when carrying of the carrier 110 or the boat 217 is interrupted, as shown in FIG. 5A, a "contents displayed on the monitor 7 at the time of interruption" is stored in the hard disk 9 as an interruption screen 7a, and if an operator inputs an re-display request through the key input device 8, the interruption screen 7a is reduced and is re-displayed on the monitor 7 as shown in FIG. 5B. Since the situation when a carrying operation of the carrier 110 or the boat 217 is interrupted can be easily re-displayed, an operator can easily check operation states of carrying mechanisms, contents of a carrying command, or existence of a carrying disallowable factor, thereby making it easy to analyze the reason of interruption and perform a recovery process from the interruption state.

Other Embodiments of the Present Invention

The shapes of various icons displayed on a manipulation screen are not limited to the arrow shapes described in the previous embodiment. The shapes of icons can be varied. In addition, the present invention can be applied to glass substrate processing apparatuses such as LCD apparatuses as well as substrate processing apparatuses for manufacturing semiconductor devices. Furthermore, the present invention can be applied to single-wafer type apparatuses or horizontal apparatuses as well as vertical apparatuses.

According to the substrate processing apparatus and the display method for the substrate processing apparatus of the present invention, during a carrying operation, the positions, transportation origins, and transportation destinations of carrying systems including a carrier or a boat can be easily checked by monitoring a manipulation screen, and thus it can be check in real time whether a carrying operation is surely carried out by a desired carrying system. That is, since the carrying operation state of a substrate can be checked from operation states of carrying systems, proper management is possible for the carrying operation of a substrate. Accordingly, although there is an error or interruption during a carrying operation of a carrying system, a recovery process can be rapidly performed. In addition, since the operation state of a carrying system is stored when a carrying error occurs, although a desired substrate processing result is not obtained in a later process (for example, an inspection process), it will take less time to analyze related data.

Other Preferred Embodiments

The present invention also includes the following embodiments.

According to an embodiment of the present invention, there is provided a substrate processing apparatus comprising:

a carrying mechanism configured to carry a substrate;

a manipulation unit configured to receive a command for the carrying mechanism and display an operation state of the carrying mechanism on a manipulation screen; and a control unit configured to control an operation of the carrying mechanism, wherein when a carrying operation of the carrying mechanism is started, the control unit transmits a carrying start message containing information about a transportation origin and a transportation destination of the carrying mechanism to the manipulation unit;

when the carrying operation of the carrying mechanism is terminated, the control unit transmits a carrying end message to the manipulation unit;

when the manipulation unit receives the carrying start message, the manipulation unit displays a carrying system icon indicating the carrying mechanism and a carrying-out icon at predetermined positions of the manipulation screen corresponding to the transportation origin of the carrying mechanism, and a carrying-in icon at a predetermined position of the manipulation screen corresponding to the transportation destination of the carrying mechanism; and when the manipulation unit receives the carrying end message, the manipulation unit removes the carrying-out icon and the carrying-in icon from the manipulation screen and moves the carrying mechanism icon to a position of the manipulation screen corresponding to the transportation destination of the carrying mechanism.

According to another embodiment of the present invention, there is provided a substrate processing apparatus comprising:

a carrying mechanism configured to carry a substrate;

a manipulation unit configured to receive a command for the carrying mechanism and display an operation state of the carrying mechanism on a manipulation screen; and a control unit configured to control an operation of the carrying mechanism, wherein if a carrying operation of the carrying mechanism is disallowed, the control unit transmits a carrying allowable/disallowable notice message containing a carrying disallowable reason to the manipulation unit, and when the manipulation unit receives the carrying allowable/disallowable notice message, the manipulation unit stores an image indicating a carrying state at the time when the carrying allowable/disallowable notice message is received so as to re-display the image on the manipulation screen later.

Preferably, when the manipulation unit receives the carrying allowable/disallowable notice message, the manipulation unit may transmit contents of the carrying allowable/disallowable notice message and an image file indicating a carrying state at the time when the carrying allowable/disallowable notice message is received.

According to another embodiment of the present invention, there is provided a substrate processing apparatus comprising:

a carrying mechanism configured to carry substrates;

a substrate holding tool to which the substrates are placed by the carrying mechanism;

a manipulation unit configured to receive a command for the carrying mechanism and display an operation state of the carrying mechanism on a manipulation screen; and a control unit configured to control an operation of the carrying mechanism, wherein when the substrate holding tool starts to be lifted/lowered, the control unit transmits a lifting/lowering start message containing information about a transportation origin and a transportation destination of the substrate holding tool to the manipulation unit;

when the lifting/lowering of the substrate holding tool stops, the control unit transmits a lifting/lowering end message to the manipulation unit;

when the manipulation unit receives the lifting/lowering start message, the manipulation unit displays a direction icon on the manipulation screen to indicate a direction from the transportation origin to the transportation destination of the substrate holding tool;

while the substrate holding tool is being lifted/lowered, the manipulation unit moves an icon indicating the substrate holding tool based on actual positional information in a state where the direction icon is being displayed; and when the manipulation unit receives the lifting/lowering end message, the manipulation unit removes the direction icon from the manipulation screen and stops the icon indicating the substrate holding tool.

According to another embodiment of the present invention, there is provided a substrate processing apparatus comprising:

a carrying mechanism configured to carry a substrate;

a manipulation unit configured to receive a command for the carrying mechanism and display an operation state of the carrying mechanism on a manipulation screen; and a control unit configured to control an operation of the carrying mechanism, wherein when a carrying operation by the carrying mechanism is started, the control unit transmits a carrying start message containing information about a transportation origin and a transportation destination of the carrying mechanism to the manipulation unit;

when the carrying operation of the carrying mechanism is terminated, the control unit transmits a carrying end message to the manipulation unit;

when the manipulation unit receives the carrying start message, the manipulation unit displays a carrying-out icon at a predetermined position of the manipulation screen corresponding to the transportation origin of the carrying mechanism and a carrying-in icon at a predetermined position of the manipulation screen corresponding to the transportation destination of the carrying mechanism; and when the manipulation unit receives the carrying end message, the manipulation unit removes the carrying-out icon and the carrying-in icon from the manipulation screen.

(Operation in the Case of Carrying Interruption: Store Snapshot for Re-Display)

Preferably, if the carrying operation of the carrying mechanism is disallowed, the control unit may transmit a carrying allowable/disallowable notice message containing a carrying disallowable reason to the manipulation unit, and when the manipulation unit receives the carrying allowable/disallowable notice message, the manipulation unit may store an image indicating a carrying state at the time when the carrying allowable/disallowable notice message is received in a storage device (as a file) so as to re-display the image on the manipulation screen later.

(Operation in the Case of Carrying Interruption: Redisplay Snapshot)

Preferably, when the manipulation unit receives a request for re-displaying the image indicating the carrying state at the time when the carrying allowable/disallowable notice message is received, the manipulation unit may re-display the image on the manipulation screen.

(Operation in the Case of Carrying Interruption: Display Carrying Interruption Icon and Reject Input)

Preferably, if the carrying operation of the carrying mechanism is disallowed, the control unit may transmit a carrying allowable/disallowable notice message containing a carrying disallowable reason to the manipulation unit, and when the manipulation unit receives the carrying allowable/disallowable notice message, the manipulation unit may display a carrying interruption icon at a predetermined position of the manipulation screen and reject an input to the carrying mechanism.

(Operation in the Case of Carrying Interruption: Display Carrying Interruption Reason)

Preferably, if the carrying interruption icon is pressed, the manipulation unit may display the carrying disallowable reason contained in the carrying allowable/disallowable notice message on the manipulation screen.

(Shapes of Carrying-Out Icon and Carrying-In Icon)

Preferably, the carrying-out icon may be an upward arrow icon pointing from a predetermined position of the manipulation screen corresponding to the transportation destination to a region outside the predetermined position, and the carrying-in icon may be a downward arrow icon pointing to a predetermined position of the manipulation screen corresponding to the transportation origin from a region outside the predetermined position.

(Display of Current Position of Boat)

The substrate holding tool may be lifted and lowered by the carrying mechanism, and the substrate processing apparatus may comprise a readable memory unit configured to store a maximum height H1 and a minimum height H2 of the substrate holding tool, and a sensor configured to detect a current height H3 of the substrate holding tool and transmit the current height H3 to the manipulation unit, wherein the manipulation unit may read the maximum height H1 and the minimum height H2 from the memory unit and receive the current height H3 of the substrate holding tool from the sensor, and the manipulation unit may determine a current height h3 of an image of the substrate holding tool displayed on the manipulation screen based on the equation of $(H1-H3):(H3-H2)=(h1-h3):(h3-h2)$ where h1 and h2 denote maximum and minimum heights of the image of the substrate holding tool, respectively.

(Display of Carrying Direction of Boat)

When the substrate holding tool starts to be lifted/lowered, the control unit may transmit a lifting/lowering start message containing information about a transportation origin and a transportation destination of the substrate holding tool to the manipulation unit, when the lifting/lowering of the substrate holding tool is terminated, the control unit may transmit a lifting/lowering end message to the manipulation unit, when the manipulation unit receives the lifting/lowering start message, the manipulation unit may display a direction icon (arrow icon) pointing from the transportation origin to the transportation destination of the substrate holding tool on the manipulation unit, and when the manipulation unit receives the lifting/lowering end message, the manipulation unit may remove the direction icon (arrow icon) from the manipulation unit.

(Substrate Processing Method)

According to another embodiment of the present invention, there is provided a display method for a substrate processing apparatus including a carrying system configured to carry a substrate, a manipulation unit configured to receive a command for the carrying system and display an operation state of the carrying system on a manipulation screen, and a control unit configured to control an operation of the carrying system, the display method comprising:

the control unit starting a carrying operation of the carrying system and transmitting a carrying start message containing information about a transportation origin and a transportation destination of the carrying system to the manipulation unit;

the manipulation unit receiving the carrying start message and displaying a carrying-out icon at a predetermined position of the manipulation screen corresponding to the transportation origin of the carrying system and a carrying-in icon at a predetermined position of the manipulation screen corresponding to the transportation destination of the carrying system;

the control unit terminating the carrying operation of the carrying system and transmitting a carrying end message to the manipulation unit; and the manipulation unit receiving the carrying end message and removing the carrying-out icon and the carrying-in icon from the manipulation screen.

What is claimed is:

1. A substrate processing apparatus comprising:
a carrying system configured to carry a substrate;
a manipulation unit configured to display an operation state of the carrying system on a manipulation screen; and
a control unit configured to control a carrying operation of the carrying system,
wherein, when the carrying operation of the carrying system is started, the control unit transmits a carrying start message containing information about a transportation origin and a transportation destination of the carrying system to the manipulation unit;
when the carrying operation of the carrying system is terminated, the control unit transmits a carrying end message containing carrying end information of the carrying system to the manipulation unit;
when the manipulation unit receives the carrying start message, the manipulation unit displays a carrying system icon indicating the carrying system which is a carrying target object and a carrying-out icon at predetermined positions of the manipulation screen corresponding to the transportation origin of the carrying system, and a carrying-in icon at a predetermined position of the manipulation screen corresponding to the transportation destination of the carrying system; and
when the manipulation unit receives the carrying end message, the manipulation unit removes the carrying-out icon and the carrying-in icon from the manipulation screen and displays the carrying system icon at a predetermined position of the manipulation screen corresponding to a transportation destination of the substrate.

2. The apparatus of claim 1, wherein the control unit transmits a carrying allowable/disallowable notice message containing a carrying disallowable reason to the manipulation unit when the carrying operation of the carrying system is disallowed, and when the manipulation unit receives the carrying allowable/disallowable notice message, the manipulation unit stores an image indicating a carrying state at a time of receiving the carrying allowable/disallowable notice message.

3. The substrate processing apparatus of claim 2, wherein, when the manipulation unit receives the carrying allowable/disallowable notice message, the manipulation unit displays contents of the carrying allowable/disallowable notice message and the image on the manipulation screen.

4. The apparatus of claim 1, wherein the control unit transmits a carrying allowable/disallowable notice message containing a carrying disallowable reason to the manipulation unit when the carrying operation of the carrying system is disallowed, and when the manipulation unit receives the carrying allowable/disallowable notice message, the manipulation unit displays a carrying interruption icon at a predetermined position of the manipulation screen and rejects a carrying start command inputted through an input device.

5. The apparatus of claim 4, wherein the manipulation unit displays the carrying disallowable reason contained in the carrying allowable/disallowable notice message on the manipulation screen when the carrying interruption icon is pressed.

6. The apparatus of claim 1, wherein the carrying-out icon comprises a upward arrow directing from a position of the manipulation screen corresponding to the transportation origin to a position other than the position of the manipulation screen corresponding to the transportation origin, and the carrying-in icon comprises a downward arrow directing from a position of the manipulation screen corresponding to the transportation destination to a position other than the position of the manipulation screen corresponding to the transportation destination.

7. The apparatus of claim 1, wherein the control unit generates and transmits an error notice message including a carrying allowable/disallowable flag value and a factor list or a transportation origin/transportation destination information to the manipulation unit, and the manipulation unit checks a content of the error notice message to collects monitor data indicating states of units other than the carrying system when the error notice message is received, and stores an error information file including the content of the error notice message and the monitor data.

8. The apparatus of claim 7, wherein the error information file comprises an index information including at least one of an alarm ID and an error occurrence date.

9. The apparatus of claim 7, wherein the error information file comprises an index information including at least one of an alarm ID and an error occurrence date.

10. The apparatus of claim 9, wherein the manipulation unit searches the error information file using the index information and re-displays a screen at a time of an error using the monitor data included in the error information file.

11. The apparatus of claim 9, wherein the manipulation unit searches the error information file using the index information and re-displays a screen at a time of an error using the monitor data included in the error information file.

12. A substrate processing apparatus comprising:
a carrying system configured to carry substrates;
a substrate holding tool included in the carrying system and configured to receive the substrates;
a manipulation unit configured to display a carrying state of the substrate holding tool on a manipulation screen; and
a control unit configured to control a carrying operation of the carrying system,
wherein, when the substrate holding tool starts to be lifted/lowered, the control unit transmits a lifting/lowering start message containing information about a transportation origin and a transportation destination of the substrate holding tool to the manipulation unit;
when a lifting/lowering of the substrate holding tool stops, the control unit transmits a lifting/lowering end message containing lifting/lowering end information of the substrate holding tool to the manipulation unit;
when the manipulation unit receives the lifting/lowering start message, the manipulation unit displays a direction icon on the manipulation screen to indicate a direction from the transportation origin to the transportation destination of the substrate holding tool;
while the substrate holding tool is being lifted/lowered, the manipulation unit moves a carrying system icon indicating the substrate holding tool based on actual positional information in a state where the direction icon is being displayed; and
when the manipulation unit receives the lifting/lowering end message, the manipulation unit removes the direction icon from the manipulation screen and stops the carrying system icon indicating the substrate holding tool.

13. The apparatus of claim 12, wherein the control unit transmits a carrying allowable/disallowable notice message containing a carrying disallowable reason to the manipulation unit when the carrying operation of the carrying system is disallowed, and when the manipulation unit receives the carrying allowable/disallowable notice message, the manipulation unit stores an image indicating a carrying state at a time of receiving the carrying allowable/disallowable notice message.

14. The substrate processing apparatus of claim 13, wherein, when the manipulation unit receives the carrying allowable/disallowable notice message, the manipulation unit displays contents of the carrying allowable/disallowable notice message and the image on the manipulation screen.

15. The apparatus of claim 12, wherein the control unit transmits a carrying allowable/disallowable notice message containing a carrying disallowable reason to the manipulation unit when the carrying operation of the carrying system is disallowed, and when the manipulation unit receives the carrying allowable/disallowable notice message, the manipulation unit displays a carrying interruption icon at a predetermined position of the manipulation screen and rejects a carrying start command inputted through an input device.

16. The apparatus of claim 15, wherein the manipulation unit displays the carrying disallowable reason contained in the carrying allowable/disallowable notice message on the manipulation screen when the carrying interruption icon is pressed.

17. The apparatus of claim 12, wherein the substrate holding tool is lifted and lowered by the carrying system,
wherein the substrate processing apparatus comprises a readable memory unit configured to store a maximum height H1 and a minimum height H2 of the substrate holding tool, and a sensor configured to detect a current height H3 of the substrate holding tool and transmit the current height H3 to the manipulation unit, and wherein the manipulation unit reads the maximum height H1 and the minimum height H2 from the memory unit and receive the current height H3 of the substrate holding tool from the sensor, and the manipulation unit determines a current height h3 of an image of the substrate holding tool displayed on the manipulation screen based on an equation of (H1−H3):(H3−H2)=(h1−h3):(h3−h2), where h1 and h2 denote maximum and minimum heights of the image of the substrate holding tool, respectively.

18. The apparatus of claim 12, wherein the control unit generates and transmits an error notice message including a carrying allowable/disallowable flag value and a factor list or a transportation origin/transportation destination information to the manipulation unit, and the manipulation unit checks a content of the error notice message to collects monitor data indicating states of units other than the carrying system when the error notice message is received, and stores an error information file including the content of the error notice message and the monitor data.

19. A display method performed in a substrate processing apparatus including a carrying system configured to carry a substrate, a manipulation unit configured to display an operation state of the carrying system on a manipulation screen, and a control unit configured to control a carrying operation of the carrying system, the display method comprising:

(a) starting the carrying operation of the carrying system and transmitting a carrying start message containing information about a transportation origin and a transportation destination of the carrying system from the control unit to the manipulation unit;

(b) displaying a carrying system icon indicating the carrying system at a predetermined position of the manipulation screen corresponding to the transportation origin of the carrying system and a carrying-in icon at a predetermined position of the manipulation screen corresponding to the transportation destination of the carrying system when the carrying start message transmitted by the control unit is received by the manipulation unit;

(c) terminating the carrying operation of the carrying system and transmitting a carrying end message from the control unit to the manipulation unit; and (d) removing the carrying-out icon and the carrying-in icon from the manipulation screen when the carrying end message transmitted by the control unit is received.

20. A display method performed in a substrate processing apparatus including a carrying system configured to carry substrates, a substrate holding tool included in the carrying system and configured to receive the substrates, a manipulation unit configured to display a carrying state of the substrate holding tool on a manipulation screen, and a control unit configured to control a carrying operation of a carrying system, the display method comprising:

(a) transmitting a lifting/lowering start message containing an information about a transportation origin and a transportation destination of the substrate holding tool from the control unit to the manipulation unit when the substrate holding tool starts to be lifted/lowered;

(b) displaying a direction icon on the manipulation screen to indicate a direction from the transportation origin to the transportation destination of the substrate holding tool when the lifting/lowering start message is received by the manipulation unit;

(c) moving a carrying system icon indicating the substrate holding tool based on an actual positional information thereof with the direction icon being displayed on the manipulation screen while the substrate holding tool is being lifted/lowered;

(d) transmitting a lifting/lowering end message containing a lifting/lowering end information of the substrate holding tool from the control unit to the manipulation unit when a lifting/lowering of the substrate holding tool stops; and (e) removing the direction icon from the manipulation screen and stopping the carrying system icon indicating the substrate holding tool when the lifting/lowering end message is received by the manipulation unit.

* * * * *